(12) United States Patent
Han et al.

(10) Patent No.: US 10,832,948 B2
(45) Date of Patent: Nov. 10, 2020

(54) SEMICONDUCTOR DEVICE AND METHOD FOR FABRICATING THE SAME

(71) Applicant: SAMSUNG ELECTRONICS CO., LTD., Suwon-si (KR)

(72) Inventors: Kyu Hee Han, Hwaseong-si (KR); Jong Min Baek, Seoul (KR); Viet Ha Nguyen, Yongin-si (KR); Woo Kyung You, Incheon (KR); Sang Shin Jang, Gwangyang-si (KR); Byung Hee Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/854,979

(22) Filed: Apr. 22, 2020

(65) Prior Publication Data

US 2020/0251376 A1    Aug. 6, 2020

Related U.S. Application Data

(63) Continuation of application No. 15/612,102, filed on Jun. 2, 2017, now Pat. No. 10,658,231.

(30) Foreign Application Priority Data

Sep. 30, 2016  (KR) .......................... 10-2016-0126063

(51) Int. Cl.
*H01L 21/768*   (2006.01)
*H01L 23/522*   (2006.01)
(Continued)

(52) U.S. Cl.
CPC .... *H01L 21/7682* (2013.01); *H01L 21/31111* (2013.01); *H01L 21/31116* (2013.01); *H01L 21/76826* (2013.01); *H01L 21/76834* (2013.01); *H01L 21/76849* (2013.01); *H01L 23/5222* (2013.01); *H01L 23/5283* (2013.01);
(Continued)

(58) Field of Classification Search
CPC ........... H01L 21/7682; H01L 21/76826; H01L 21/31116; H01L 21/31111
See application file for complete search history.

(56) References Cited

U.S. PATENT DOCUMENTS 7,199,043 B2   4/2007  Park
7,811,924 B2  10/2010  Cui et al.
(Continued)

FOREIGN PATENT DOCUMENTS

| JP | 2007-188919 A | 7/2007 |
|---|---|---|
| KR | 10-2014-0099289 A | 8/2014 |
| WO | WO 2013-101096 A1 | 7/2013 |

*Primary Examiner* — Kyoung Lee
*Assistant Examiner* — Christina A Sylvia
(74) *Attorney, Agent, or Firm* — Lee IP Law, P.C.

(57) ABSTRACT

A semiconductor device includes a first interlayer dielectric film on a substrate, first and second wires respectively extending in a first direction within the first interlayer dielectric film, the first and second wires being adjacent to each other in a second direction different from the first direction, a hard mask pattern on the first interlayer dielectric film, the hard mask pattern including an opening, and an air gap within the first interlayer dielectric film, the air gap including a first portion overlapping vertically with the opening and a second portion not overlapping with the opening in the first direction.

16 Claims, 43 Drawing Sheets

(51) Int. Cl.
*H01L 23/532* (2006.01)
*H01L 21/311* (2006.01)
*H01L 23/528* (2006.01)

(52) U.S. Cl.
CPC .... *H01L 23/5329* (2013.01); *H01L 23/53238* (2013.01); *H01L 23/53295* (2013.01)

(56) References Cited

U.S. PATENT DOCUMENTS

| | | |
|---|---|---|
| 7,928,003 B2 | 4/2011 | Naik |
| 8,034,693 B2 | 10/2011 | Shibata et al. |
| 8,383,507 B2 | 2/2013 | Chanda et al. |
| 9,123,727 B2 | 9/2015 | Fischer |
| 9,368,362 B2 | 6/2016 | Rha et al. |
| 9,780,027 B2 * | 10/2017 | Bergendahl ....... H01L 21/76816 |
| 2006/0088975 A1 | 4/2006 | Ueda |
| 2009/0093100 A1 | 4/2009 | Xia et al. |
| 2012/0126413 A1 * | 5/2012 | Braeckelmann .... H01L 21/7682 257/773 |
| 2013/0207267 A1 | 8/2013 | Rho |
| 2014/0191401 A1 | 7/2014 | Fischer |
| 2016/0172231 A1 | 6/2016 | Lee et al. |
| 2016/0307842 A1 | 10/2016 | Baek et al. |

* cited by examiner

US 10,832,948 B2

SEMICONDUCTOR DEVICE AND METHOD FOR FABRICATING THE SAME

CROSS-REFERENCE TO RELATED APPLICATIONS

This is a continuation application based on pending application Ser. No. 15/612,102, filed Jun. 2, 2017, the entire contents of which is hereby incorporated by reference.

Korean Patent Application No. 10-2016-0126063, filed on Sep. 30, 2016, in the Korean Intellectual Property Office, and entitled: "Semiconductor Device and Method for Fabricating the Same," is incorporated by reference herein in its entirety.

BACKGROUND

1. Field

The present disclosure relates to a semiconductor device and a method for fabricating the same.

2. Description of the Related Art

As downscaling of a semiconductor device is accelerated with the development of the electronic technology, high-integration and low-power of a semiconductor chip are demanded. In response to a demand for high-integration and low-power of a semiconductor device, feature size of a semiconductor device continuously decreases and a dielectric constant of an intermetal dielectric film continuously decreases at a back end-of-line (BEOL) process. Meanwhile, according to decrease of feature size, enhancement for resistance capacitance and reliability of a dielectric film between wires may be important.

SUMMARY

According to an aspect of embodiments, there is provided a semiconductor device including a substrate, a first interlayer dielectric film on the substrate, first and second wires respectively extending in a first direction within the first interlayer dielectric film and being adjacent to each other in a second direction different from the first direction, a hard mask pattern including an opening, on the first interlayer dielectric film, and an air gap within the first interlayer dielectric film, the air gap including a first portion overlapping vertically with the opening and a second portion non-overlapping with the opening in the first direction.

According to another aspect of embodiments, there is provided a semiconductor device including a substrate, a first interlayer dielectric film on the substrate, first and second wires extending respectively in a first direction within the first interlayer dielectric film and being adjacent to each other in a second direction different from the first direction, a first recess includes a sidewall defined by the first and second wires within the first interlayer dielectric film between the first and second wires, and a first hard mask pattern on the first interlayer dielectric film, the first hard mask pattern including a first opening overlapping with a portion of the first recess, a portion of the first wire, and a portion of the second wire, wherein a width of the first recess in the first direction is greater than a width of the first opening in the first direction.

According to still another aspect of embodiments, there is provided a semiconductor device including an interlayer dielectric film on a substrate, a recess within the interlayer dielectric film, a wire of which at least a portion is disposed within the recess, an end portion of the wire being disposed within the recess, a hard mask pattern on the interlayer dielectric film and the wire, the hard mask pattern covering the end portion of the wire, and an air gap between the end portion of the wire and the first interlayer dielectric film.

According to yet another aspect of embodiments, there is provided a semiconductor device including a substrate, a first interlayer dielectric film on the substrate, first and second wires respectively extending in a first direction within the first interlayer dielectric film, the first and second wires being adjacent to each other in a second direction different from the first direction, a hard mask pattern on the first interlayer dielectric film, the hard mask pattern including an opening, and a recess within the first interlayer dielectric film, the recess including an air gap that overlaps vertically with the opening of the hard mask pattern and extends beyond the opening to overlap a portion of the hard mask pattern.

According to still another aspect of embodiments, there is provided a method for fabricating a semiconductor device including forming first and second wires extending respectively in a first direction within a first interlayer dielectric film and being adjacent to each other in a second direction different from the first direction, forming a hard mask pattern including an opening on the first interlayer dielectric film, the opening exposing at least a portion of the interlayer dielectric film between the first wire and the second wire, performing a plasma treatment process on the interlayer dielectric film exposed by the opening by using the hard mask pattern as a mask, forming a recess within the interlayer dielectric film by removing the plasma-treated interlayer dielectric film, a width of the recess in the first direction being greater than a width of the opening in the first direction, and forming an air gap within the recess.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
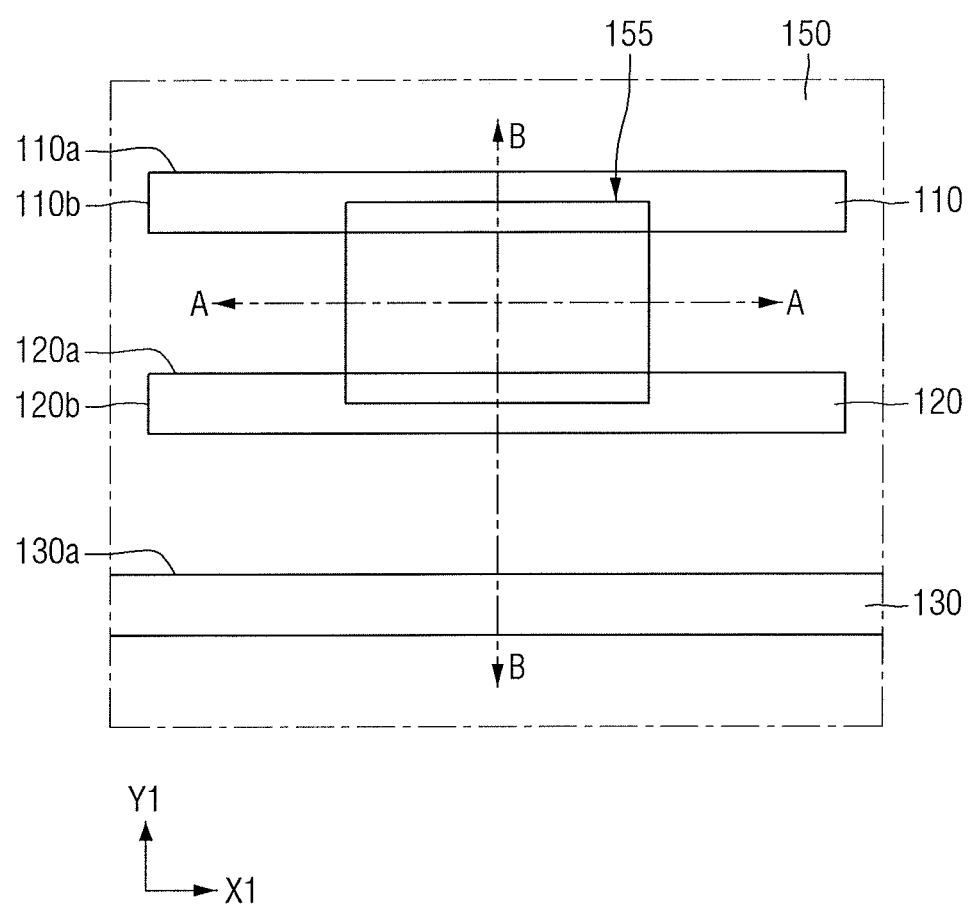
FIG. 1 illustrates a layout view of a semiconductor device according to some example embodiments.
Figure 2:
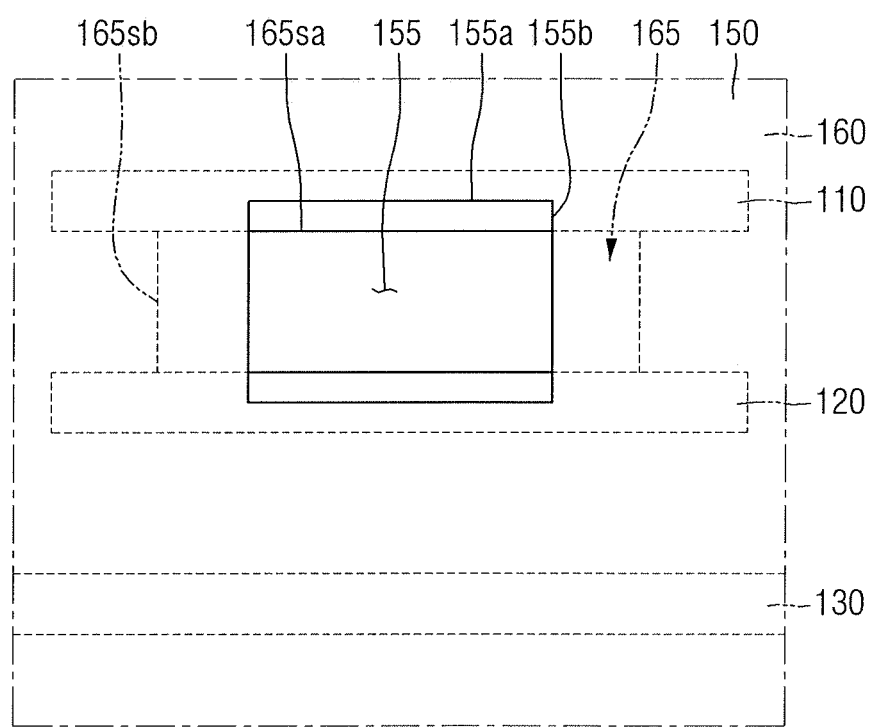
FIG. 2 illustrates a top view of the semiconductor device of FIG. 1.
Figure 3:
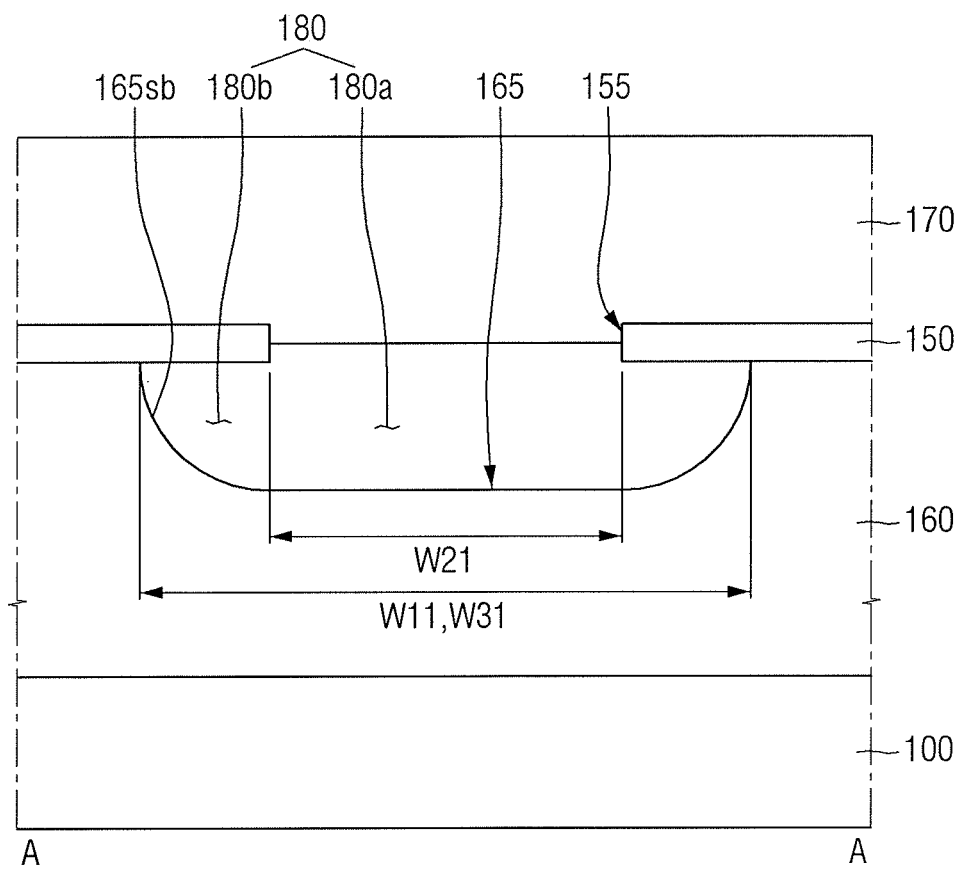
FIG. 3 illustrates a cross sectional view along line A-A of FIG. 1.
Figure 4:
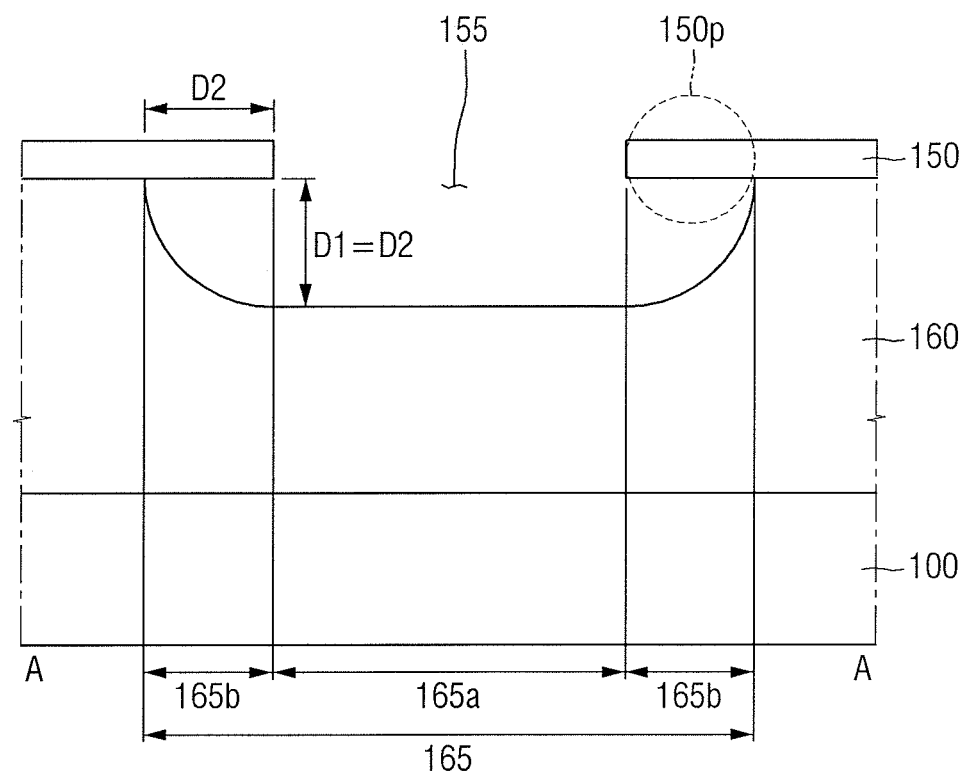
FIG. 4 illustrates a view of the first interlayer dielectric film and the first hard mask pattern of FIG. 3.
Figure 5:
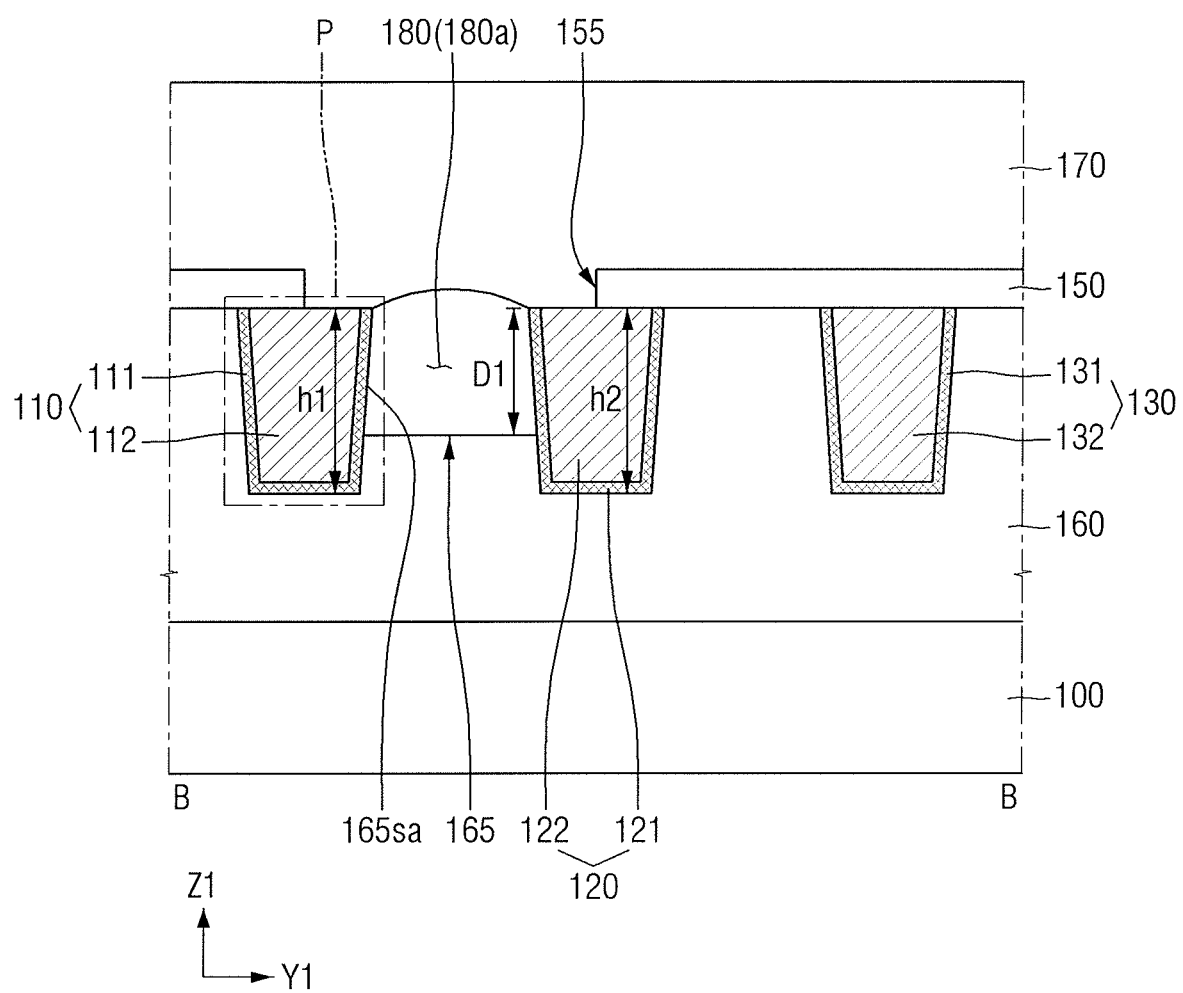
FIG. 5 illustrates a cross sectional view along line B-B of FIG. 1.
Figure 6:
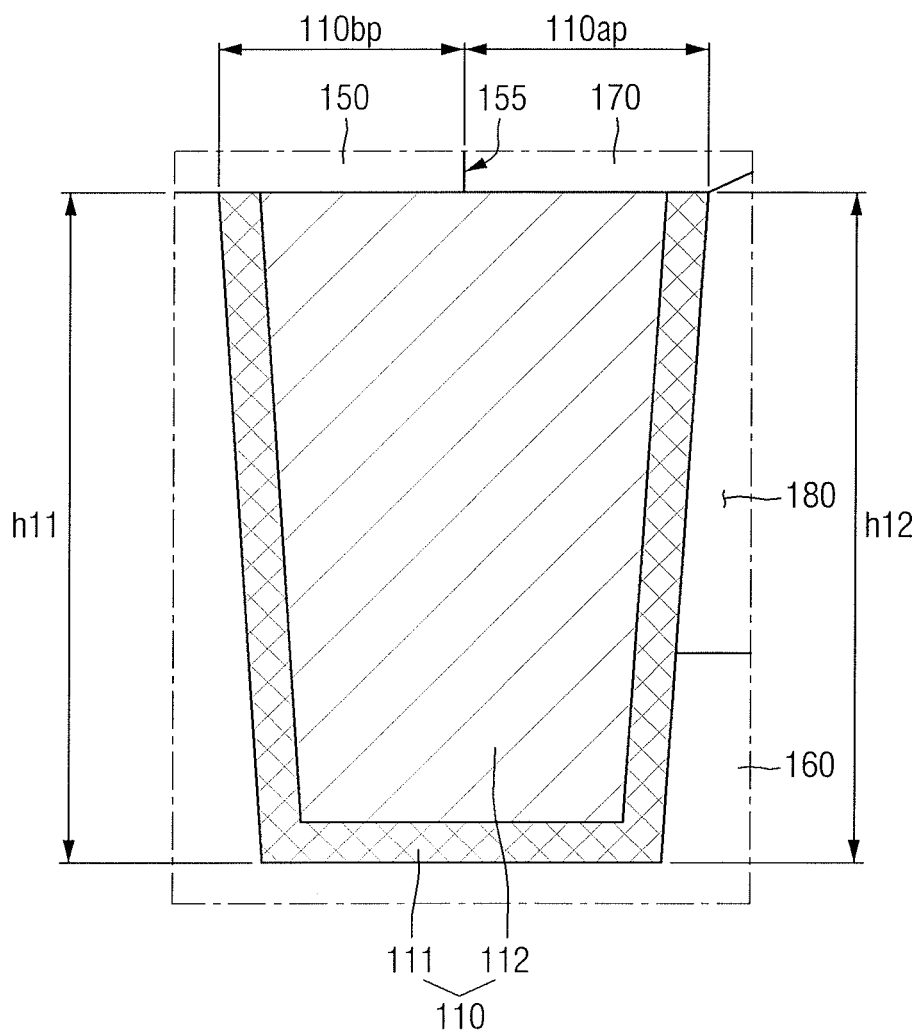
FIG. 6 illustrates an enlarged view of section P of FIG. 5.

FIG. 1 is a layout view provided to explain a semiconductor device according to some example embodiments. FIG. 2 is a top view illustrating the semiconductor device of FIG. 1. FIG. 3 is a cross sectional view along line A-A of FIG. 1. FIG. 4 is a view provided to explain relations between the interlayer dielectric film and the hard mask pattern of FIG. 3. FIG. 5 is a cross sectional view along line B-B of FIG. 1. FIG. 6 is an enlarged view of section P of FIG. 5. For reference, FIG. 2 is a top view illustrating the semiconductor device while excluding a second interlayer dielectric film 170 on a first hard mask pattern 150.

Referring to FIGS. 1 to 6, a semiconductor device according to some example embodiments may include a first interlayer dielectric film 160, the first hard mask pattern 150, first to third wires 110, 120, 130, the second interlayer dielectric film 170, a first recess 165, and a first air gap 180. The first interlayer dielectric film 160 may be formed on a substrate 100.

The substrate 100 may be a structure stacking a base substrate and an epitaxial layer, but not limited hereto. The substrate 100 may be, e.g., a silicon substrate, a gallium arsenide substrate, a silicon germanium substrate, a ceramic substrate, a quartz substrate, or a glass substrate for display, or a semiconductor on insulator (SOI) substrate.

For example, when the substrate 100 includes a silicon substrate, the substrate 100 may be a structure including a dielectric film formed on the silicon substrate 100. Further, the substrate 100 may include a conductive pattern. The conductive pattern may be a metal wire or a contact, a gate electrode of a transistor, a source/drain of a transistor, or a diode, but not limited hereto.

An etch stopping film may be additionally formed between the substrate 100 and the first interlayer dielectric film 160. The etch stopping film may include, e.g., at least one of silicon nitride (SiN), silicon oxynitride (SiON), and silicon carbonitride (SiCN). The etch stopping film may be formed by using, e.g., chemical vapor deposition, atom layer deposition, and so on.

The first interlayer dielectric film 160 may include at least one of, e.g., silicon oxide, silicon nitride, silicon oxynitride, and low-k dielectric material. For example, the first interlayer dielectric film 160 may include a low-k dielectric material to alleviate the coupling phenomenon between wires. A low-k dielectric material may be, e.g., silicon oxide having properly high carbon and hydrogen, or a material such as SiCOH.

A dielectric constant of a dielectric material may be lowered by including carbon in the dielectric material. However, in order to further lower a dielectric constant of the dielectric material, the dielectric material may include, within the dielectric material, a pore, i.e., a cavity, in which gases or airs are filled.

The low-k dielectric material of the first interlayer dielectric film 160 may include, e.g., fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), tonen silazen (TOSZ), fluoride silicate glass (FSG), polyimide nanofoams, e.g., polypropylene oxide, carbon doped silicon oxide (CDO), organo silicate glass (OSG), SiLK, amorphous fluorinated carbon, silica aerogels, silica xerogels, mesoporous silica or a combination thereof, but not limited hereto. In the semiconductor device according to some example embodiments, the first interlayer dielectric film 160 may include a low-k dielectric material having a dielectric constant less than silicon oxide.

The first wire 110, the second wire 120, and the third wire 130 may be formed within the first interlayer dielectric film 160. The first wire 110, the second wire 120, and the third wire 130 may be formed on the substrate 100.

The first wire 110, the second wire 120, and the third wire 130 may respectively extend longitudinally in a first direction X1. Further, the first wire 110, the second wire 120, and the third wire 130 may be aligned in sequence in a second direction Y1. That is, the first wire 110, the second wire 120, and the third wire 130 may be adjacent to, e.g., and spaced apart from, each other in the second direction Y1.

As illustrated in FIG. 1, the first wire 110 may include a long side 110a extending longitudinally in the first direction X and a short side 110b extending in the second direction Y1. The second wire 120 may include a long side 120a extending longitudinally in the first direction X1 and a short side 120b extending in the second direction Y1. The third wire 130 may include a long side 130a extending longitudinally in the first direction X1 and a short side extending in the second direction Y1. The long side 120a of the second wire may face the long side 110a of the first wire and the long side 130a of the third wire.

As illustrated in FIG. 5, the first wire 110 may include a first filling conductive film 112 and a first barrier conductive film 111 extending along a bottom surface and a sidewall of the first filling conductive film 112. The second wire 120 may include a second filling conductive film 122 and a second barrier conductive film 121 extending along a bottom surface and a sidewall of the second filling conductive film 121. The third wire 130 may include a third filling conductive film 132 and a third barrier conductive film 131 extending along a bottom surface and a sidewall of the third filling conductive film 132. The first to third filling conductive films 112, 122, 132 may be respectively formed on the first to third barrier conductive films 111, 121, 131.

Each of the first to third barrier conductive films 111, 121, 131 may include, e.g., at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr) zirconium nitride (ZrN), vanadium (V), vanadium nitride (VN), niobium (Nb), niobium nitride (NbN), platinum (Pt), iridium (Ir) and rhodium (Rh). For example, each of the first to third barrier conductive films 111, 121, 131 may, e.g., completely, separate the first interlayer dielectric film 160 from a corresponding one of the first to third filling conductive films 112, 122, 132.

Each of the first to third filling conductive films 112, 122, 132 may include, e.g., at least one of aluminum (Al), copper (Cu), tungsten (W), and cobalt (Co). For example, when each of the first to third filling conductive films 112, 122, 132 includes copper, the copper included in the first to third filling conductive films 112, 122, 132 may include, e.g., at least one of carbon (C), silver (Ag), cobalt (Co), tantalum (Ta), indium (In), tin (Sn), zinc (Zn), manganese (Mn), titanium (Ti), magnesium (Mg), chrome (Cr), germanium (Ge), strontium (Sr), platinum (Pt), magnesium (Mg), aluminum (Al) or zirconium (Zr).

FIG. 5 illustrates an upper surface of each of the first to third filling conductive films 112, 122, 132 being planar, but this is provided only for convenience of explanation and the example embodiments are not limited hereto. For example, the upper surface of each of the first to third filling conductive films 112, 122, 132 may be convex upwardly or downwardly.

Referring to FIGS. 2, 3, and 5, the first recess 165 may be formed within the first interlayer dielectric film 160. The first recess 165 may be formed between the first wire 110 and the second wire 120, as illustrated in FIGS. 2 and 5.

As illustrated in FIG. 2, the first recess 165 may include a first sidewall 165sa defined by the first wire 110 and the second wire 120, and a second sidewall 165sb defined by the first interlayer dielectric film 160. The first sidewall 165sa of the first recess may be defined by the long side 110a of the first wire and the long side 120a of the second wire. The second sidewall 165sb of the first recess 165, which connects the first sidewalls 165sa of the first recess 165 extending in the first direction X1, may include a curved surface. The first recess 165 will be explained below.

Referring to FIGS. 1-5, the first hard mask pattern 150 may be formed on the first interlayer dielectric film 160. The first hard mask pattern 150 may be formed on the first to third wires 110, 120, 130. For example, the first hard mask pattern 150 may be in contact with the first to third wires 110, 120, 130 and the first interlayer dielectric film 160. As used herein, the expression "in contact with" indicates that an inserting film is not formed between the first hard mask pattern 150 and the first interlayer dielectric film 160.

The first hard mask pattern 150 may include a first opening 155. The first opening 155 may expose at least a portion of the first wire 110 and the second wire 120. More specifically, the first opening 155 may vertically overlap, e.g., along a third direction Z1, with at least a portion of the first wire 110 and at least a portion of the second wire 120. Each of the first wire 10 and the second wire 120 may include a portion overlapping the first opening 155 and a portion not overlapping the first opening 155.

The first opening 155 may overlap with a portion of the first recess 165. The first recess 165 may extend in the first direction X longer than the first opening 155, e.g., as illustrated in FIGS. 2-3.

The first interlayer dielectric film 160 between the first wire 110 and the second wire 120 may be undercut under the first hard mask pattern 150. That is, as illustrated in FIGS. 3-4, the first hard mask pattern 150 may include a protruding portion 150p laterally protruding from an uppermost portion of the first recess 165 farther than the second sidewall 165sb of the first recess, e.g., the protruding portion 150p may extend horizontally along the first direction X1 to overhang a portion of the first recess 165. The protruding portion 150p of the first hard mask pattern 150 may not be in contact with the first interlayer dielectric film 160. Relations between the first opening 155 of the first hard mask pattern 150 and the first recess 165 will be described below.

As illustrated in FIG. 2, the first opening 155 may be formed by the joining of a first sidewall 155a extending in the first direction X1 with a second sidewall 155b extending in the second direction Y1. In the semiconductor device according to some example embodiments, the first sidewall 155a of the first opening may be placed on upper surfaces of the first wire 110 and the second wire 120 extending longitudinally in the first direction X1. That is, among the first sidewalls 155a of the first opening which are parallel to each other, one first sidewall 155a may be placed on, e.g., above, the first wire 110, and the other first sidewalls 155a of the first opening parallel thereto may be placed on, e.g., above, the second wire 120.

For example, the first hard mask pattern 150 may include at least one of silicon nitride (SiN), silicon oxynitride (SiON), and silicon carbonitride (SiCN). In the semiconductor device according to some example embodiments, it is described that the first hard mask pattern 150 includes silicon carbonitride.

As illustrated in FIGS. 3 and 5, the second interlayer dielectric film 170 may be formed on the first hard mask pattern 150. The second interlayer dielectric film 170 may block the first opening 155. The second interlayer dielectric film 170 may include at least one of, e.g., silicon oxide, silicon nitride, silicon oxynitride, and low-k dielectric material. The second interlayer dielectric film 170 may include, e.g., a low-k dielectric material, but not limited hereto.

As illustrated in FIGS. 3 and 5, the first air gap 180 may be formed within the first interlayer dielectric film 160. The first air gap 180 may be formed between the first interlayer dielectric film 160 and the second interlayer dielectric film 170 as the first opening 155 is blocked with the second interlayer dielectric film 170. At least a portion of the first air gap 180 may vertically overlap with the first opening 155.

At least a portion of the first air gap 180 may be disposed within the first recess 165, e.g., the first air gap 180 may fill the first recess 165. That is, the first air gap 180 may be formed within the first interlayer dielectric film 160 between the first wire 110 and the second wire 120.

The protruding portion 150p of the first hard mask pattern 150 may include an upper surface facing the second interlayer dielectric film 170, and a bottom surface facing the first interlayer dielectric film 160, e.g., a portion of the first air gap 180 may be between the bottom surface of the protruding portion 150p and the first interlayer dielectric film 160. The second interlayer dielectric film 170 may be formed on an upper surface of the protruding portion 150p of the first hard mask pattern 150. In the semiconductor device according to some example embodiments, the second interlayer dielectric film 170 may not be formed between a bottom surface of the protruding portion 150p of the first hard mask pattern 150 and the first air gap 180.

Referring to FIGS. 2 to 4, a width W11 of the first recess 165 in the first direction X1 may be greater than a width W21 of the first opening 155 in the first direction X1. The width difference between W11 and W21 may account for a width of the protruding portion 150p.

The first recess 165 may include a first portion 165a vertically overlapping with the first opening 155 and a second portion 165b non-overlapping with the first opening 155. The second portion 165b of the first recess 165 may vertically overlap with the protruding portion 150p of the first hard mask pattern 150.

In the semiconductor device according to some example embodiments, the second portion 165b of the first recess may be disposed on both sides of the first portion 165a of the first recess based on the first portion 165a of the first recess, when viewed in a cross-sectional view. The second portion 165b of the first recess may be disposed on both sides of the first portion 165a of the first recess in the first direction X1. As illustrated in FIG. 5, because the opposed first sidewalls 155a of the first opening are respectively positioned on the first wire 110 and the second wire 120, a width of the first recess 165 in the second direction Y1 may be less than a width of the first opening 155 in the second direction Y1.

In the semiconductor device according to some example embodiments, a depth D1 of the first recess 165 may be substantially equal to a depth D2 of the second portion 165b of the first recess in the first direction X1. The depth D2 of the first interlayer dielectric film 160 undercut under the first hard mask pattern 150 may be substantially equal to the depth D1 of the first recess 165. On a border of the first interlayer dielectric film 160 with the first hard mask pattern 150, the depth D2 of the first hard mask pattern 150 protruding from the sidewall of the first recess 165 may be substantially equal to the depth D1 of the first recess 165.

Further, as illustrated in FIG. 5, in the semiconductor device according to some example embodiments, the depth DL of the first recess 165 may be equal to or less than a height h1 of the first wire 110, and equal to or less than a height h2 of the second wire. In other words, a distance from a lower surface of the first interlayer dielectric film 160 to a bottom surface of the first recess 165 may be equal to or greater than a distance from a lower surface of the first interlayer dielectric film 160 to a bottom surface of the first wire 110, and equal to or greater than a distance from a lower surface of the first interlayer dielectric film 160 to a bottom surface of the second wire 120.

That is, even when the first recess 165 is formed between the first wire 110 and the second wire 120, the bottom surface of the first wire 110 and the bottom surface of the second wire 120 may be adjoined with the first interlayer dielectric film 160. When the depth D1 of the first recess 165 is greater than the height h1 of the first wire 110 and/or the height h2 of the second wire, the first wire 110 and/or the second wire 120 may be inclined.

In FIGS. 3 and 4, a width W31 of the first air gap 180 in the first direction X1 may be greater than the width W21 of the first opening 155 in the first direction X1. The first air gap 180 may include a first portion 180a vertically overlapping with the first opening 155 and a second portion 180b non-overlapping with the first opening 155. The second portion 180b of the first air gap may not overlap with the first opening 155 in the first direction X1. The second portion 180b of the first air gap may vertically overlap with the protruding portion 150p of the first hard mask pattern.

In the semiconductor device according to some example embodiments, the second portion 180b of the first air gap may be disposed on both sides of the first portion 180a of the first air gap based on the first portion 180a of the first air gap. The second portion 180b of the first air gap may be disposed on both sides of the first portion 180a of the first air gap in the first direction X1. Only the first portion 180a of the first air gap 180 may be positioned between the first wire 110 and the second wire 120 overlapping with the first opening 155. It is further noted that the first and second portions 180a and 180b of the first air gap 180 may define a single air gap, and the first and second portions 180a and 180b are defined only for ease of description.

In FIG. 6, the first wire 110 may include a first portion 110ap overlapping with the first opening 155 and a second portion 110bp non-overlapping with the first opening 155. That is, referring to FIGS. 5-6, a top of the second portion 110bp of the first wire 110 may be covered by the second interlayer dielectric film 170, while the first portion 110ap of the first wire 110 may be exposed by the second interlayer dielectric film 170 to define the first opening 155.

In the semiconductor device according to some example embodiments, a height h12 of the first barrier conductive film 111 in the first portion 110ap of the first wire 110 may be substantially equal to a height h11 of the first barrier conductive film 111 in the second portion 110bp of the first wire 110. In other words, the height h12 from the bottom surface of the first wire 110 at the first portion 100ap of the first wire to an uppermost portion of the first barrier conductive film 111 may be substantially equal to the height h11 from the bottom surface of the first wire 110 at the second portion 110bp of the first wire to an uppermost portion of the first barrier conductive film 111.

In the semiconductor device according to some example embodiments, at a location where the upper surface of the first filling conductive film 112 at the second portion 110bp of the first wire meets the first barrier conductive film 111, the first barrier conductive film 111 may not include a portion protruding upward higher than the upper surface of the first filling conductive film 112. That is, upper most surfaces of the first filling conductive film 112 and the first barrier conductive film 111 may be substantially level with each other.

While FIGS. 1, 2, and 5 illustrate that the first wire 110, the second wire 120, and the third wire 130 have same height and width, this is provided so only for convenience of explanation and the example embodiments are not limited hereto.

While FIGS. 1, 2, and 5 illustrate the three wires 110, 120, 130 aligned in parallel in the second direction Y1, this is provided only for convenience of explanation and the example embodiments are not limited hereto. That is, the two wires aligned in parallel in the second direction Y1 may be formed, or four or more wires may be formed.

While FIGS. 1, 2, and 5 illustrate that the first to third wires 110, 120, 130 are spaced apart by equal intervals, this is provided only for convenience of explanation and example embodiments are not limited hereto.

While FIGS. 1, 2, and 5 illustrate only the three wires 110, 120, 130 extending longitudinally in the first direction X1, this is provided only for convenience of explanation and the example embodiments are not limited hereto. Another wire extending in the second direction Y1 may be formed between the first wire 110 and the second wire 120 and/or between the second wire 120 and the third wire 130.

Further, while FIGS. 1, 2, and 5 illustrate that there are two wires being partially exposed by the first opening 155, this is provided only for convenience of explanation and the example embodiments are not limited hereto. That is, there may be three or more wires exposed by the first opening 155. In the above case, one or more wires may be additionally formed between the first wire 110 and the second wire 120.

Figure 7A:
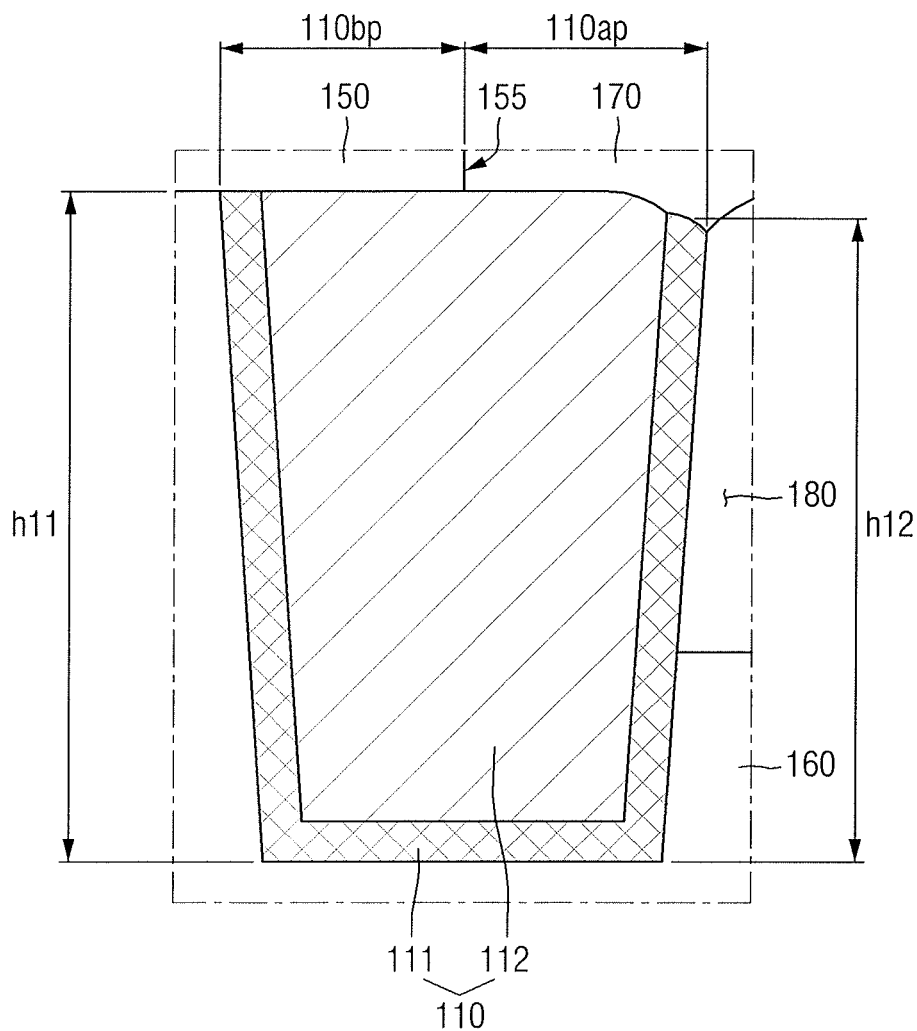
FIGS. 7A to 7C illustrate example views of a semiconductor device according to some example embodiments.
Figure 7B:
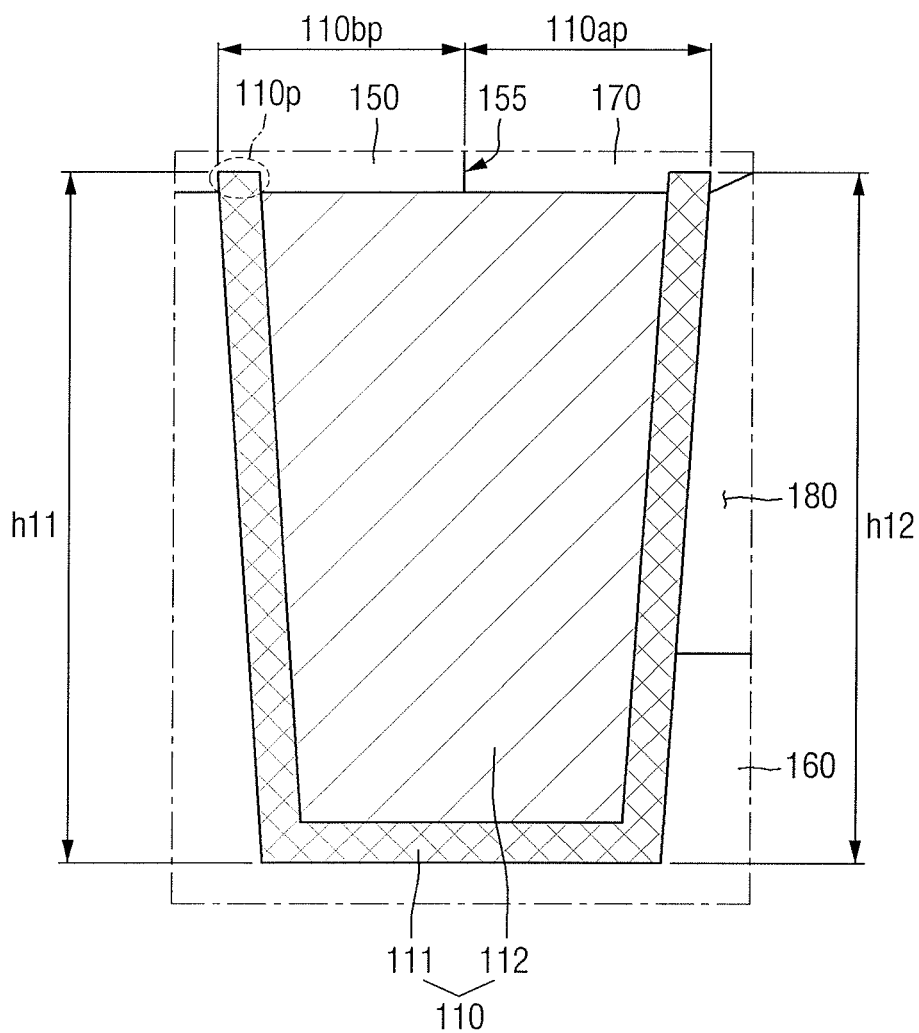
Figure 7C:
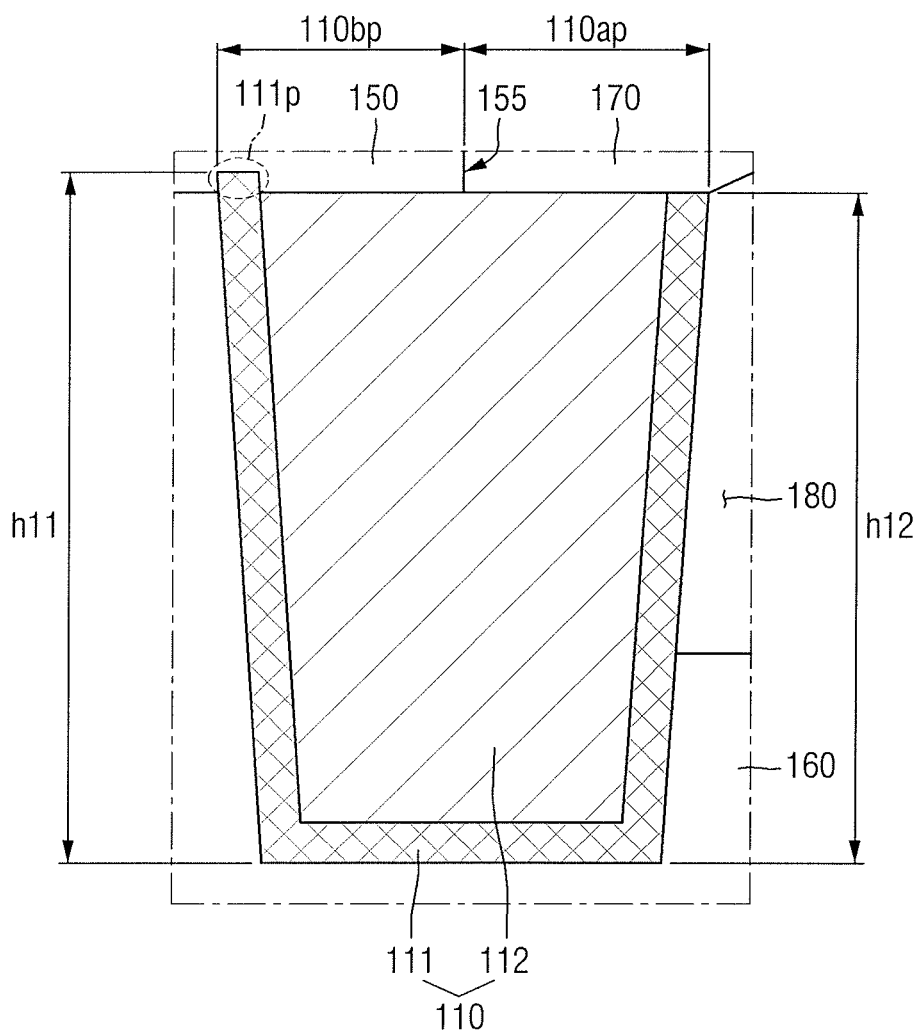

FIGS. 7A to 7C are example views provided to explain a semiconductor device according to some example embodiments. For convenience of explanation, differences that are not explained above with reference to FIGS. 1 to 6 will be mainly explained below. For reference, each of FIGS. 7A to 7C may be a cross sectional view along the second direction Y1 of the first wire 110.

Referring to FIG. 7A, in the semiconductor device according to some example embodiments, the height h12 of the first barrier conductive film 111 at the first portion 110ap of the first wire may be less than the height h11 of the first barrier conductive film 111 at the second portion 110bp of the first wire.

In detail, in a process of forming the first opening 155, a portion of the first barrier conductive film 111 at the first portion 110ap of the first wire may be etched. However, because the second portion 110bp of the first wire may be covered by the first hard mask pattern 150, the first barrier conductive film 111 at the second portion 110bp of the first wire may not be etched. FIG. 7A illustrates that a portion of the first filling conductive film 112 may have an etched shape at the first portion 110ap of the first wire, although example embodiments are not limited hereto.

Referring to FIG. 7B, in the semiconductor device according to some example embodiments, at a location where an upper surface of the first filling conductive film 112 at the second portion 110bp of the first wire meets the first barrier conductive film 111, the first barrier conductive film 111 may include a portion 111p protruding upward higher than the upper surface of the first filling conductive film 112. Because there is a difference in the etching degree between the first barrier conductive film 111 and the first filling conductive film 112 in a process of forming the first wire 110, the first barrier conductive film 111 may include a portion 111p protruding upward higher than the upper surface of the first filling conductive film 112.

Referring to FIG. 7C, in the semiconductor device according to some example embodiments, the height h12 of the first barrier conductive film 111 at the first portion 110ap of the first wire may be less than the height h11 of the first barrier conductive film 111 at the second portion 110bp of the first wire. Further, at a location where the upper surface of the first filling conductive film 112 at the second portion 110bp of the first wire meets the first barrier conductive film 111, the first barrier conductive film 111 may include a portion 111p protruding upward higher than the upper surface of the first filling conductive film 112.

In a process of forming the first opening 155, a portion of the first barrier conductive film 111 at the first portion 110ap of the first wire may be etched. Further, in a process of forming the first wire 110, the first barrier conductive film 111 may include the portion 111p protruding upward higher than the upper surface of the first filling conductive film 112.

Unlike the illustration in FIG. 7C, at a location where the upper surface of the first filling conductive film 112 at the first portion 110ap of the first wire meets the first barrier conductive film 111, a portion of the first barrier conductive film 111 may be protruding higher than the upper surface of the first filling conductive film 112.

Figure 8:
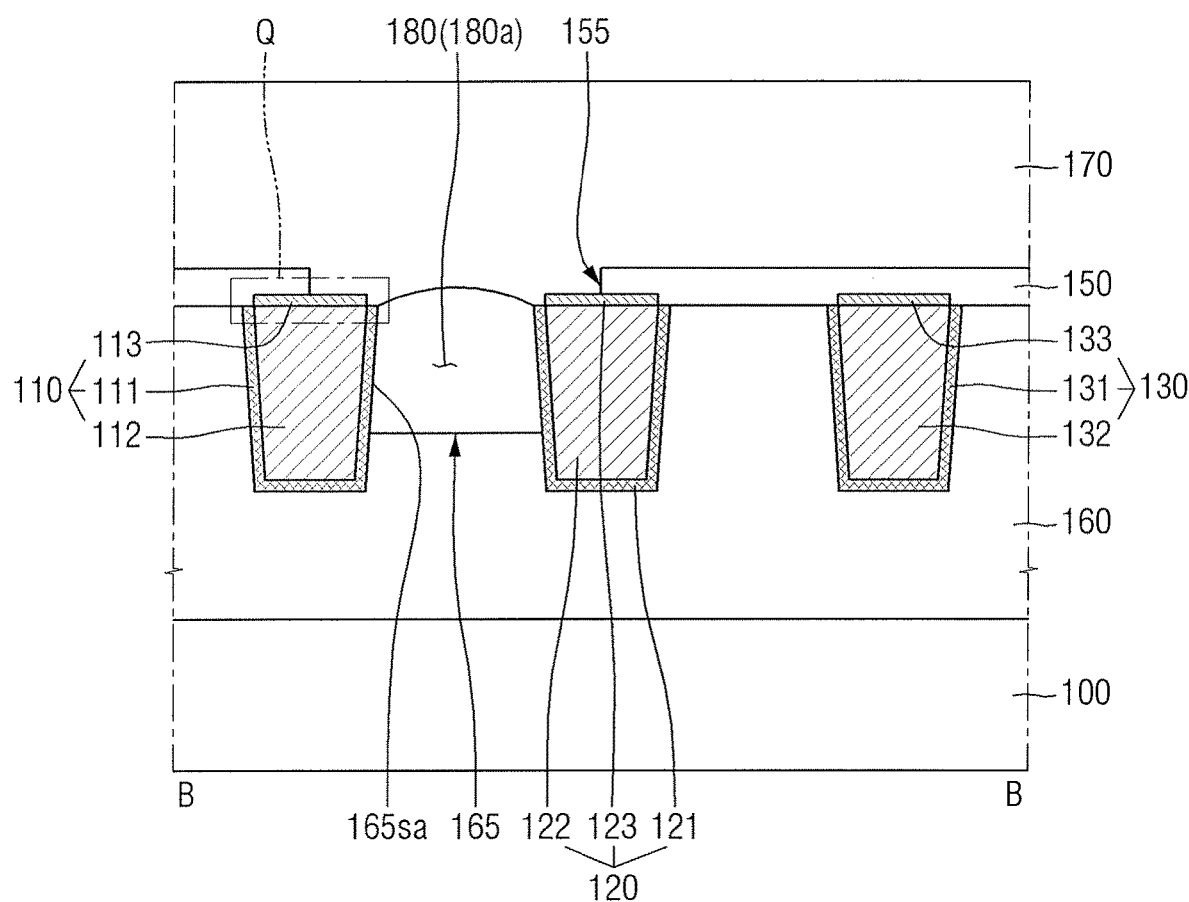
FIG. 8 illustrates a view of a semiconductor device according to some example embodiments.
Figure 9:
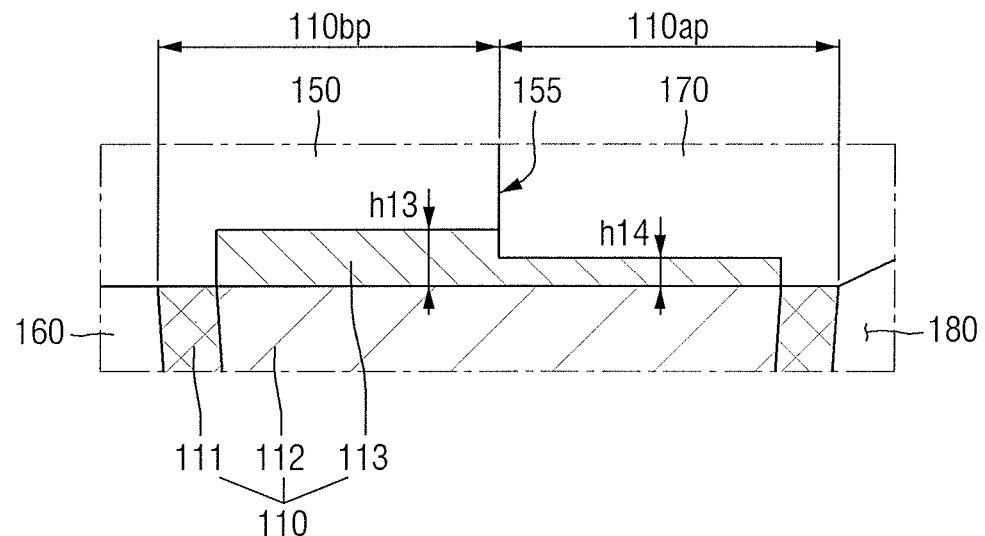
FIG. 9 illustrates an enlarged view of section Q of FIG. 8.

FIG. 8 is a view provided to explain a semiconductor device according to some example embodiments. FIG. 9 is an enlarged view of section Q of FIG. 8. For convenience of explanation, differences that are not explained above with reference to FIGS. 1 to 6 will be mainly explained below. For reference, FIG. 8 corresponds to a cross sectional view along line B-B of FIG. 1.

Referring to FIGS. 8 and 9, in the semiconductor device according to some example embodiments, each of the first to third wires 110, 120, 130 may further include first to third capping conductive films 113, 123, 133. For example, the first capping conductive film 113 may be disposed on the upper surface of the first filling conductive film 112. The first capping conductive film 113 may extend along the upper surface of the first filling conductive film 112. Each of the first to third capping conductive films 113, 123, 133 may include, e.g., at least one of cobalt (Co), tungsten (W), aluminum (Al), tantalum (Ta), titanium (Ti), nickel (Ni), ruthenium (Ru), or aluminum nitride (AlN).

For example, as illustrated in FIG. 8, each of the first to third capping conductive films 113, 123, 133 may, e.g., completely, cover a top of first through third filling conductive film 112, 122, 132, respectively. The first to third capping conductive films 113, 123, 133 may minimize loss of metal, e.g., Cu, first through third filling conductive film 112, 122, 132, respectively, during subsequent processing.

For example, a thickness h14 of the first capping conductive film 113 at the first portion 110ap of the first wire 110 may be less than a thickness h13 of the first capping conductive film 113 at the second portion 110bp of the first wire 110, as illustrated in FIG. 9. In a process of forming the first opening 155, a portion of the first capping conductive film 113 at the first portion 110ap of the first wire 110 may be etched, e.g., removed.

In another example, a thickness of the first capping conductive film 113 at the first portion 110ap of the first wire may be also equal to a thickness of the first capping conductive film 113 at the second portion 110bp of the first wire. Further, while FIGS. 8 and 9 illustrate that the first capping conductive film 113 is not deposited on the uppermost surface of the first barrier conductive film 111, this is provided only for convenience of explanation and the example embodiments are not limited hereto.

In FIG. 8, a portion of the second wire 120 overlapping with the first opening 155 may be similar to the first portion 110ap of the first wire.

Figure 10:
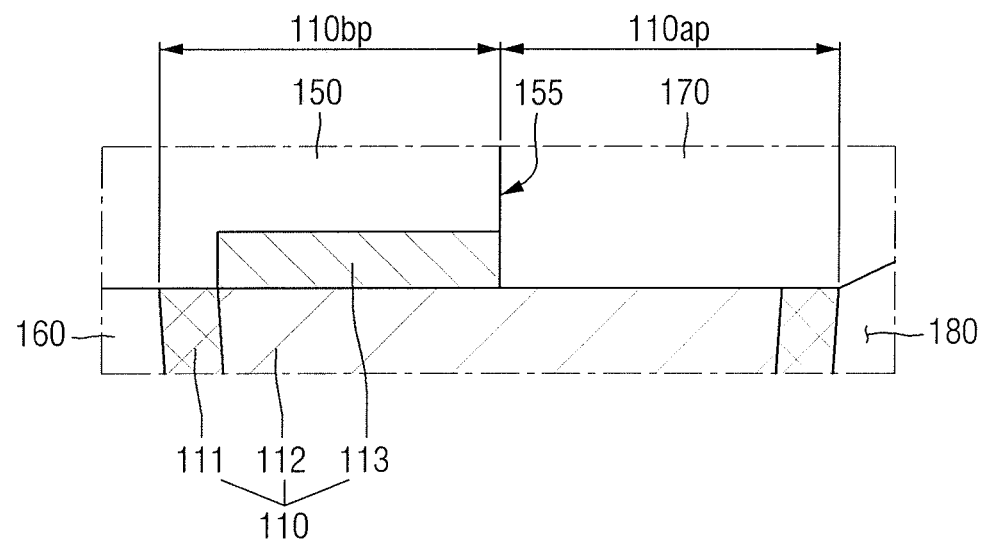
FIG. 10 illustrates a view of a semiconductor device according to some example embodiments.

FIG. 10 is a view provided to explain a semiconductor device according to some example embodiments. For convenience of explanation, differences that are not explained above with reference to FIGS. 8 and 9 will be mainly explained below. For reference, FIG. 10 is an enlarged view of section Q of FIG. 8.

Referring to FIG. 10, in the semiconductor device according to some example embodiments, the first capping conductive film 113 may not be disposed on the first filling conductive film 112 at the first portion 110ap of the first wire overlapping with the first opening 155. That is, the first capping conductive film 113 may remain at the second portion 110bp of the first wire non-overlapping with the first opening 155, and may not remain at the first portion 110ap of the first wire overlapping with the first opening 155.

Figure 11:
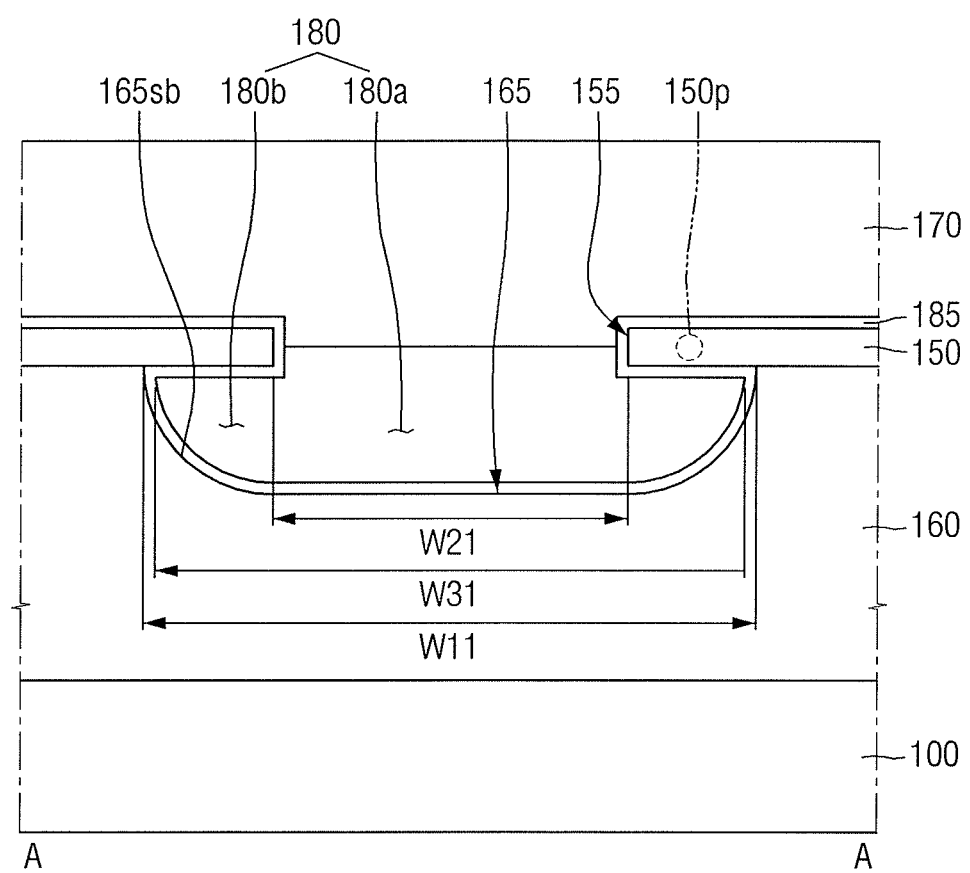
FIGS. 11 and 12 illustrate views of a semiconductor device according to some example embodiments.
Figure 12:
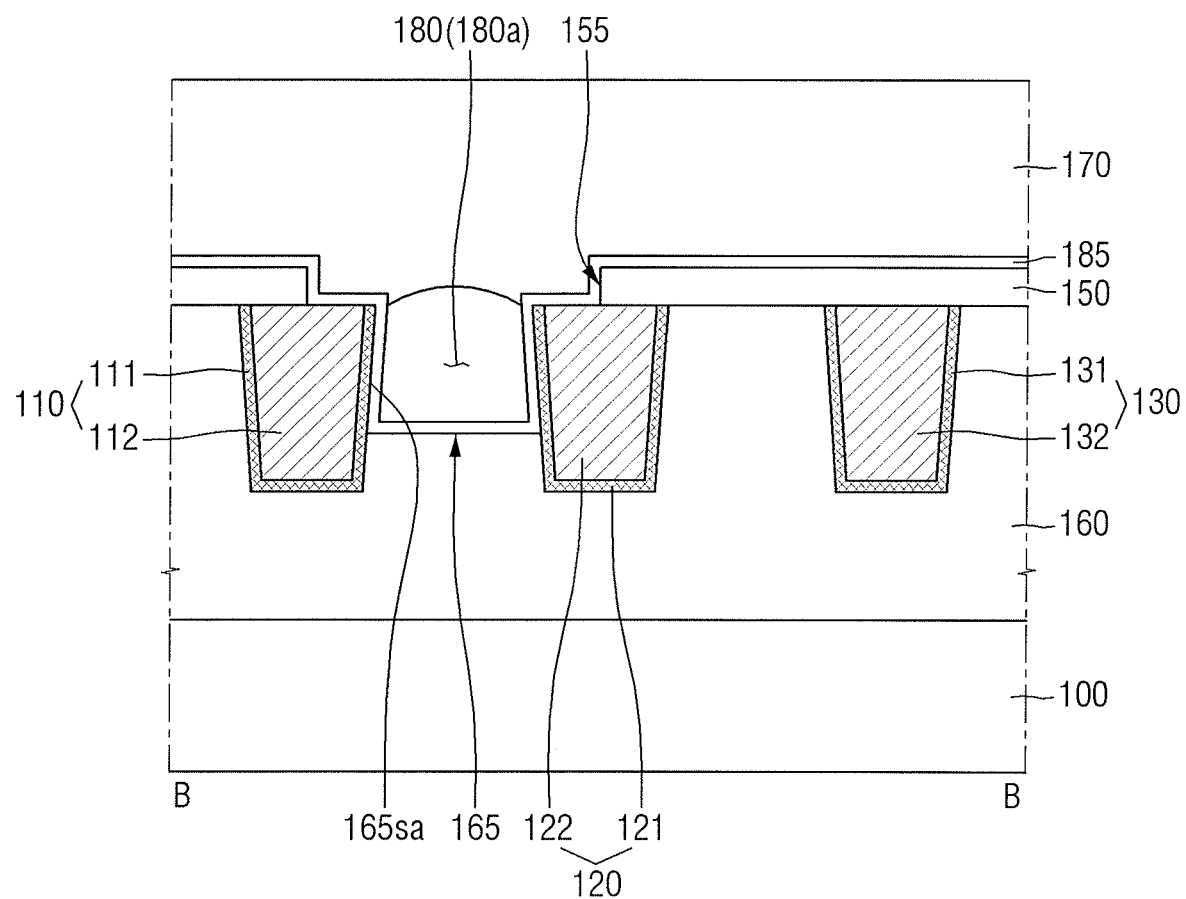

FIGS. 11 and 12 are views provided to explain a semiconductor device according to some example embodiments. For convenience of explanation, differences that are not explained above with reference to FIGS. 1 to 6 will be mainly explained below.

Referring to FIGS. 11 and 12, the semiconductor device according to some example embodiments may further include an air gap liner 185 extending along a profile of the first recess 165 and a profile of the protruding portion 150p of the first hard mask pattern. The air gap liner 185 may be formed along the second sidewall 165sb of the first recess defined by the first interlayer dielectric film 160, the bottom surface of the first recess 165, and the first sidewall 165sa of the first recess defined by the first wire 110 and the second wire 120.

The air gap liner 185 may be formed along the upper surface of the first hard mask pattern 150, and the sidewall and the bottom surface of the protruding portion 150p of the first hard mask pattern. Further, the air gap liner 185 may also be formed on upper surfaces of the first wire 110 and the second wire 120 exposed by the first opening 155.

The air gap liner 185 may include, e.g., at least one of silicon nitride (SiN), silicon oxynitride (SiON), or silicon carbonitride (SiCN). In the semiconductor device according to some example embodiments, it is described that the air gap liner 185 includes silicon carbonitride.

The second interlayer dielectric film 170 may be formed on the air gap liner 185. Because the air gap liner 185 is formed along the profile of the first recess 165, the width W31 of the first air gap 180 in the first direction X1 may be less than the width W11 of the first recess 165 in the first direction X1. Further, the width W31 of the first air gap 180 in the first direction X1 may be greater than the width W21 of the first opening 155 in the first direction X1. At least a portion of the first air gap 180 may be surrounded by the air gap liner 185, and the rest of the first air gap 180 may be surrounded by the second interlayer dielectric film 170.

FIG. 11 illustrates that the air gap liner 185 is formed conformally along the profile of the first recess 165 and the profile of the protruding portion 150p of the first hard mask pattern, but not limited hereto. For example, in the air gap liner 185 formed along the protruding portion 150p of the first hard mask pattern, a thickness of the air gap liner 185 formed between the second interlayer dielectric film 170 and the upper surface of the first hard mask pattern 150 may be greater than a thickness of the air gap liner 185 formed on the bottom surface of the protruding portion 150p of the first hard mask pattern facing the first interlayer dielectric film 160.

Figure 13:
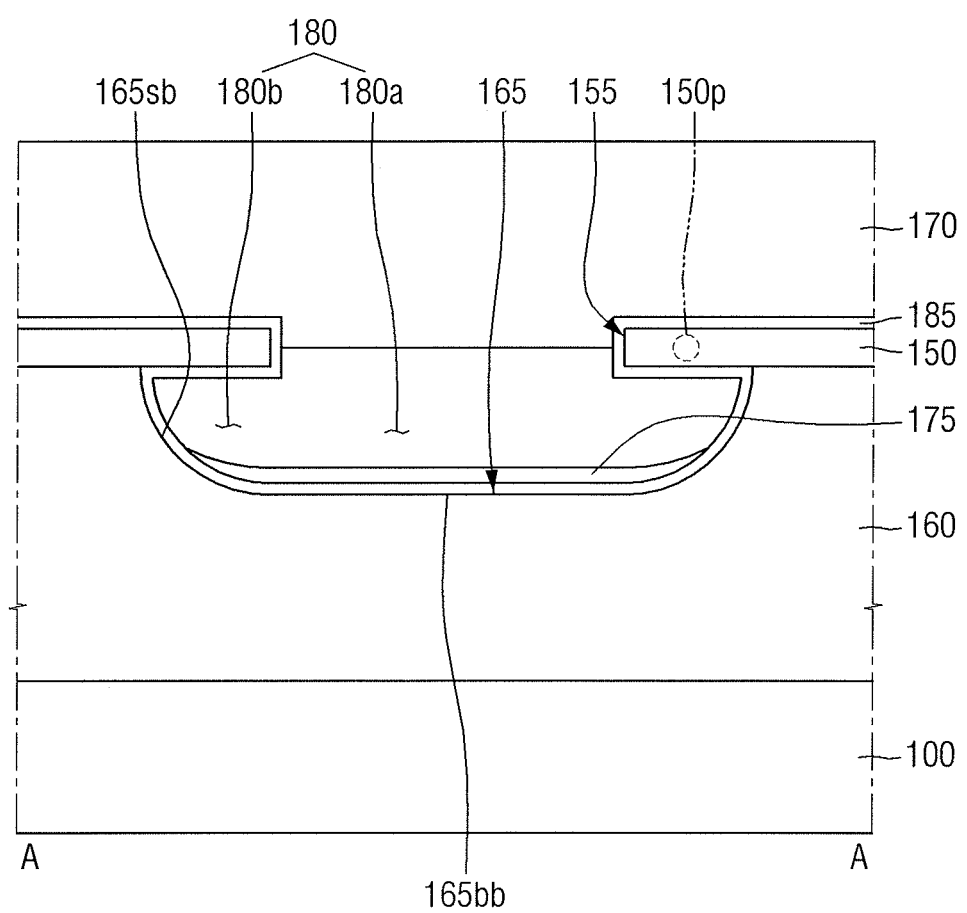
FIGS. 13 and 14 illustrate views of a semiconductor device according to some example embodiments.
Figure 14:
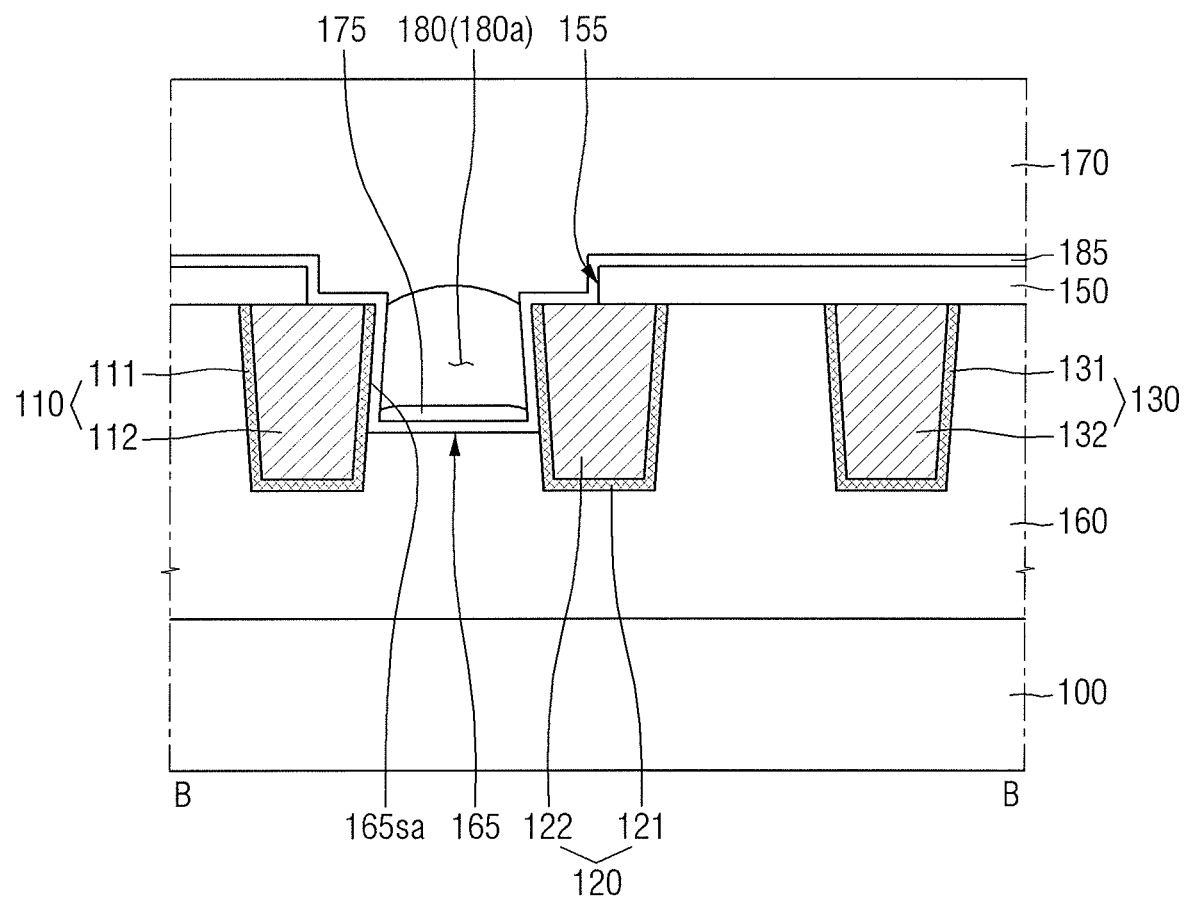

FIGS. 13 and 14 are views provided to explain a semiconductor device according to some example embodiments. For convenience of explanation, differences that are not explained above with reference to FIGS. 11 and 12 will be mainly explained below.

Referring to FIGS. 13 and 14, the semiconductor device according to some example embodiments may further include an insulating pattern 175 formed on the air gap liner 185 within the first recess 165. The insulating pattern 175 may extend along a portion of the profile of the first recess 165. The insulating pattern 175 may include a portion vertically overlapping with the first opening 155 and a portion overlapping with the protruding portion 150p of the first hard mask pattern, but not limited hereto.

During a process of forming the second interlayer dielectric film 170, the insulating pattern 175 may be formed on the bottom surface 165bb of the first recess as a portion of the second interlayer dielectric film 170 is deposited within the first recess 165. Therefore, according to a depositing method for forming the second interlayer dielectric film 170, the insulating pattern 175 may include a portion vertically overlapping with the first opening 155, and may not include a portion non-overlapping with the first opening 155.

The insulating pattern 175 may be formed on a portion of the second sidewall 165sb of the first recess. That is, the insulating pattern 175 may not be formed entirely on the second sidewall 165sb of the first recess.

In the semiconductor device according to some example embodiments, the second interlayer dielectric film 170 or the insulating pattern 175 is not formed between the air gap liner 185 on the bottom surface of the protruding portion 150p of the first hard mask pattern and the first air gap 180. Further, the insulating pattern 175 may not be connected with the second interlayer dielectric film 170. While FIG. 14 illustrates that the insulating pattern 175 may not be formed on the first sidewall 165sa of the first recess, example embodiments are not limited hereto.

Figure 15:
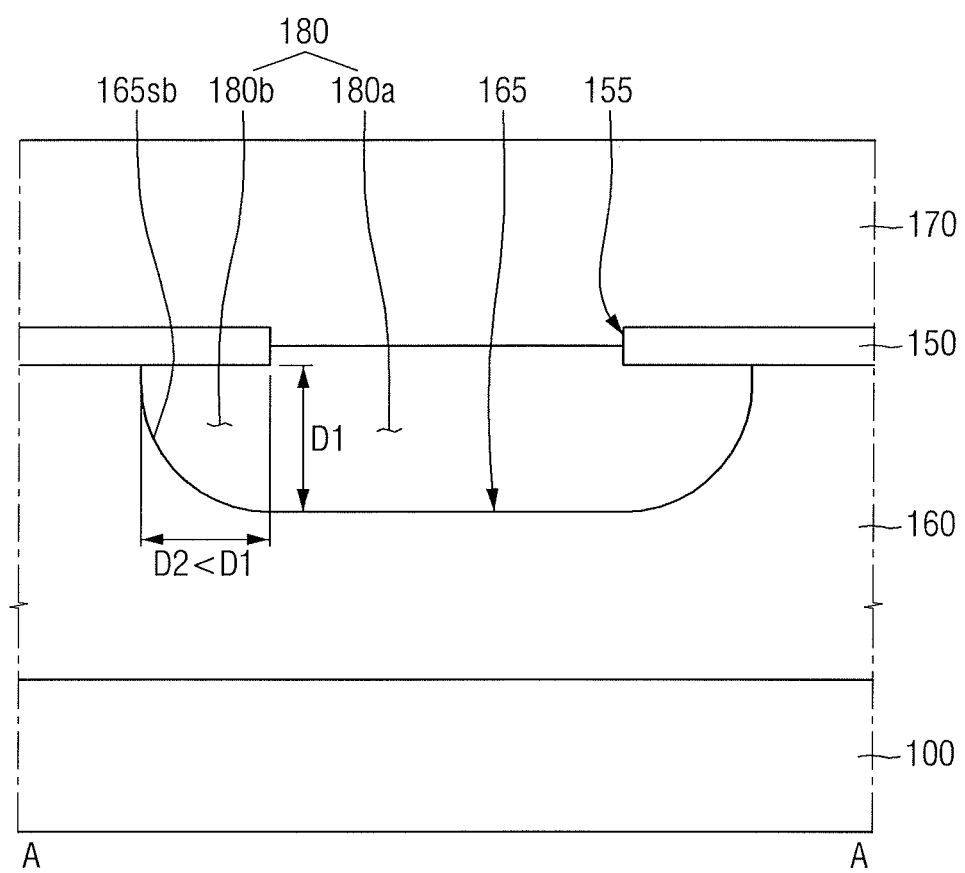
FIG. 15 illustrates a view of a semiconductor device according to some example embodiments.

FIG. 15 is a view provided to explain a semiconductor device according to some example embodiments. For convenience of explanation, differences that are not explained above with reference to FIGS. 1 to 6 will be mainly explained below.

Referring to FIG. 15, in the semiconductor device according to some example embodiments, the depth D1 of the first recess 165 may be greater than the width D2 of the first recess 165 in the first direction X1 non-overlapping with the first opening 155. In other words, the width D2 of the first interlayer dielectric film 160 undercut under the first hard mask pattern 150 may be less than the depth D1 of the first recess 165.

Figure 16:
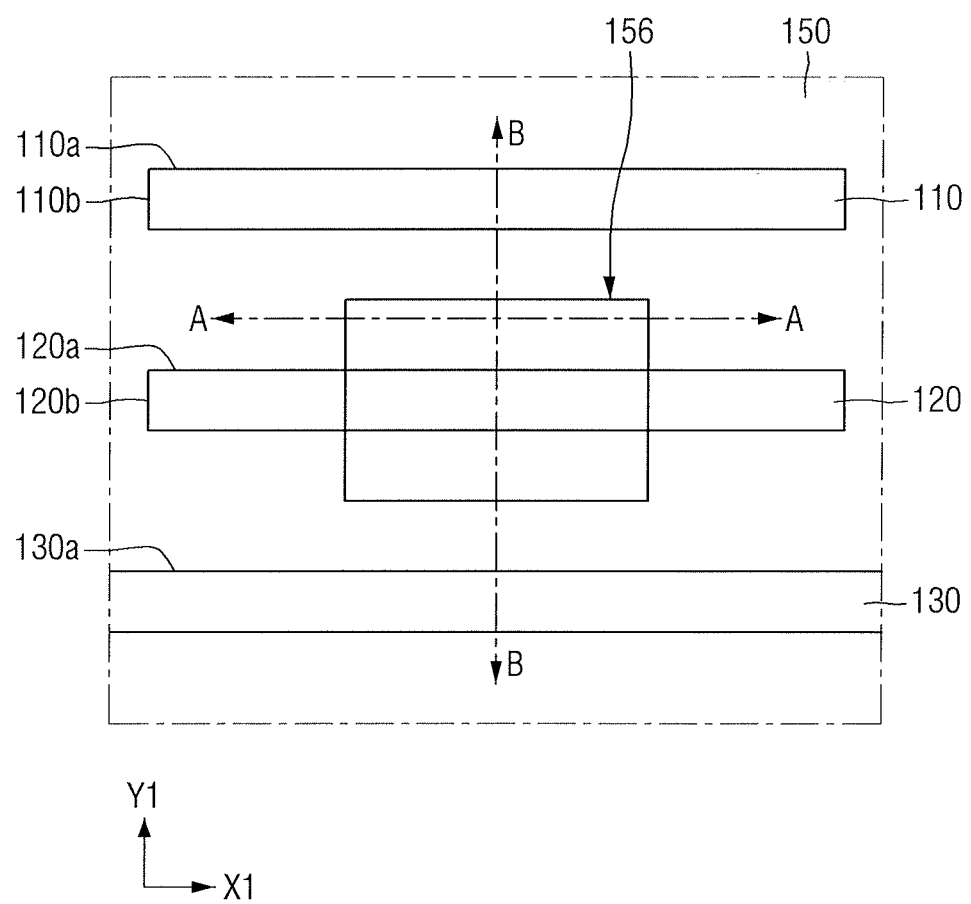
FIG. 16 illustrates a layout view of a semiconductor device according to some example embodiments.
Figure 17:
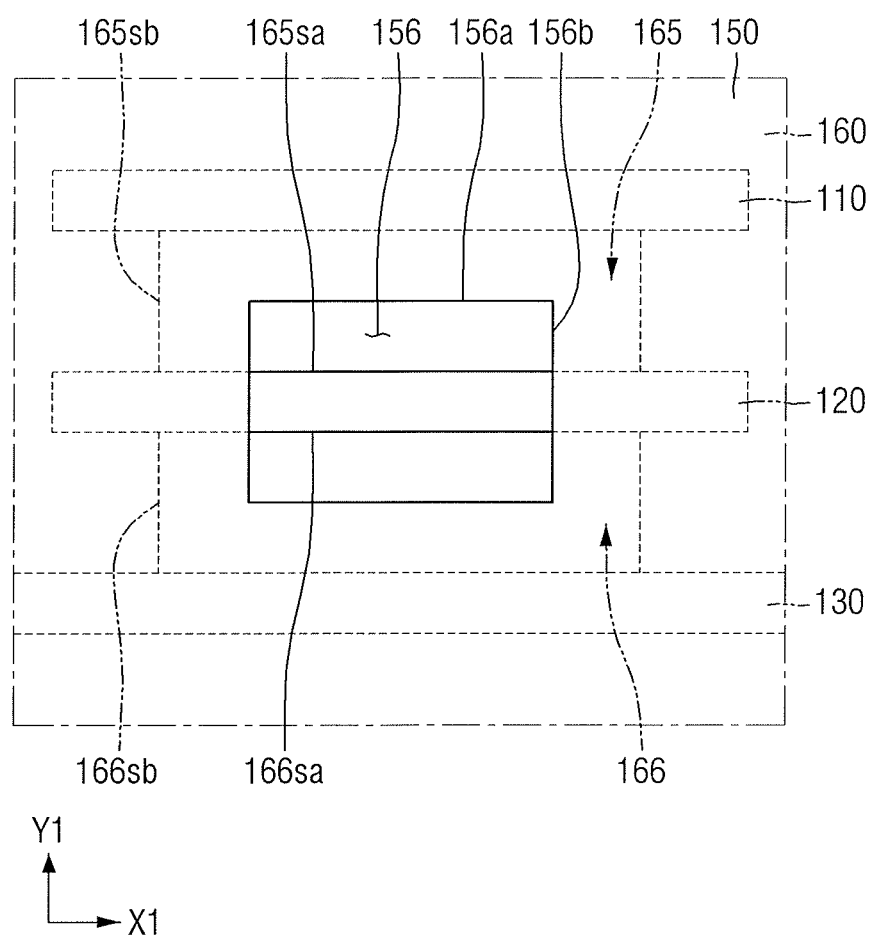
FIG. 17 illustrates a top view of the semiconductor device of FIG. 16.
Figure 18:
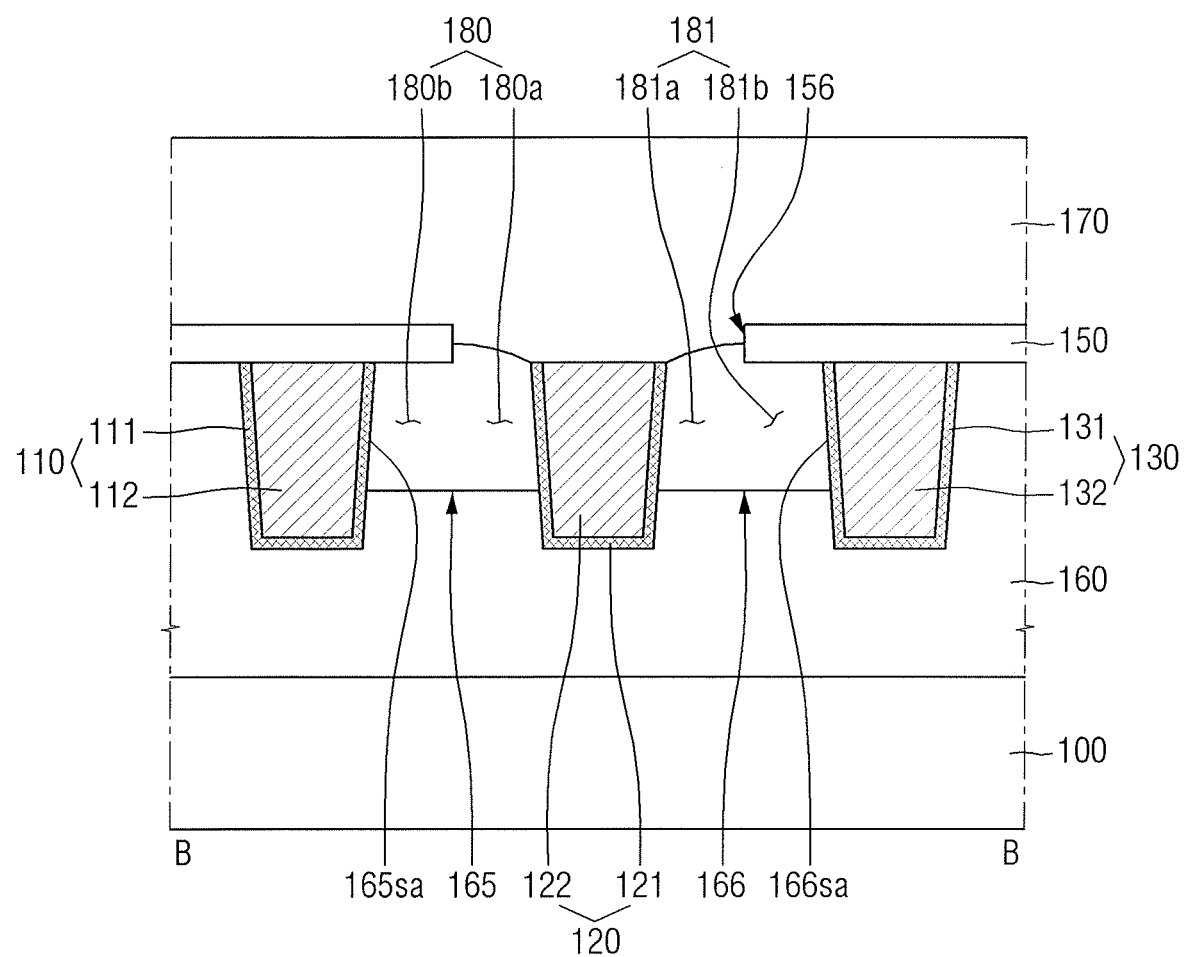
FIG. 18 illustrates a cross sectional view along line B-B of FIG. 16.

FIG. 16 is a layout view provided to explain a semiconductor device according to some example embodiments. FIG. 17 is a top view illustrating the semiconductor device of FIG. 16. FIG. 18 is a cross sectional view along line B-B of FIG. 16. For convenience of explanation, differences that are not explained above with reference to FIGS. 1 to 6 will be mainly explained below.

For reference, a cross sectional view along line A-A of FIG. 16 may be substantially similar to FIG. 3. Further, a cross sectional view cut along a portion formed with the first opening 155 between the second wire 120 and the third wire in the first direction X1 may be similar to FIG. 3. Further, FIG. 17 is a top view excluding the second interlayer dielectric film 170 on the first hard mask pattern 150.

Referring to FIGS. 16 to 18, the semiconductor device according to some example embodiments may further include the second recess 166 and a second air gap 181.

The first opening 156 of the first hard mask pattern 150 may vertically overlap with at least a portion of the second wire 120. The first opening 156 may not overlap with the first wire 110 and the third wire 130.

The first opening 156 may extend in the first direction X1 and may include first sidewalls 156a parallel to each other. The first opening 156 may include second sidewalls 156b connecting the first sidewalls 156a of the first opening.

Among the parallel first sidewalls 156a of the first opening, one first sidewall 156a may be placed on the first interlayer dielectric film 160 between the first wire 110 and the second wire 120, and the other first sidewall 156a of the first opening may be placed on the first interlayer dielectric film 160 between the second wire 120 and the third wire 130.

Unlike the illustration above, one of the first sidewalls 156a of the first opening may be placed on the first interlayer dielectric film 160, and the other first sidewall 156a of the first opening may be placed on the first wire 110 or the third wire 130.

The first recess 165 and the second recess 166 may be respectively formed within the first interlayer dielectric film 160. The first recess 165 may be formed between the first wire 110 and the second wire 120, and the second recess 166 may be formed between the second wire 120 and the third wire 130.

The first recess 165 may include the first sidewall 165sa defined by the first wire 110 and the second wire 120, and the second recess 166 may include the first sidewall 166sa defined by the second wire 120 and the third wire 130. The first recess 165 and the second recess 166 may respectively include the second sidewalls 165sb, 166sb defined by the first interlayer dielectric film 160.

In the semiconductor device according to some example embodiments, a width of the first recess 165 in the first direction X1 and a width of the second recess 166 in the first direction X1 may be respectively greater than a width of the first opening 156 in the first direction X1. Further, in the semiconductor device according to some example embodiments, a width of the first recess 165 in the second direction Y1 and a width of the second recess 166 in the second direction Y1 may be respectively greater than a distance between the first sidewall 156a of the first opening and the second wire 120.

In other words, the first hard mask pattern 150 may include a portion protruding from the first sidewall 165sa of the first recess defined by the sidewall of the first wire 110 to the second wire 120, and a portion protruding from the first sidewall 166sa of the second recess defined by the sidewall of the third wire 130 to the second wire 120.

For example, a height of the first sidewall 165sa of the first recess defined by the first wire 110 may be substantially equal to a height of the first sidewall 165sa of the first recess defined by the second wire 120. Further, a height of the first sidewall 166sa of the second recess defined by the third wire 130 may be substantially equal to a height of the first sidewall 166sa of the second recess defined by the second wire 120.

The first air gap 180 may be formed between the first wire 110 and the second wire 120 within the first interlayer dielectric film 160. The second air gap 181 may be formed between the second wire 120 and the third wire 130 within the first interlayer dielectric film 160.

In FIG. 16 which is a cross sectional view along line B-B, the first air gap 180 between the long side 110a of the first wire and the long side 120a of the second wire may include a first portion 180a overlapping with the first opening 156 and a second portion 180b non-overlapping with the first opening 156. Further, the second air gap 181 between the long side 130a of the third wire and the long side 120a of the second wire may include the first portion 181a overlapping with the first opening 156, and a second portion 181b non-overlapping with the first opening 156. Between the long side 110a of the first wire and the long side 120a of the second wire, the second portion 180b of the first air gap may be adjacent to the first wire 110, and the first portion 180a of the first air gap may be positioned between the second portion 180b of the first air gap and the second wire 120.

Likewise, between the long side 130a of the third wire and the long side 120a of the second wire, the second portion 181b of the second air gap may be adjacent to the third wire 130, and the first portion 181a of the second air gap may be positioned between the second portion 181b of the second air gap and the second wire 120. In other words, the second portion 180b of the first air gap may include a first region non-overlapping with the first opening 156 in the first direction X1 and a second region non-overlapping with the first opening 156 in the second direction Y1. Likewise, the second portion 181b of the second air gap may include a third region non-overlapping with the first opening 156 in the first direction X1 and a fourth region non-overlapping with the first opening 156 in the second direction Y1.

Figure 19:
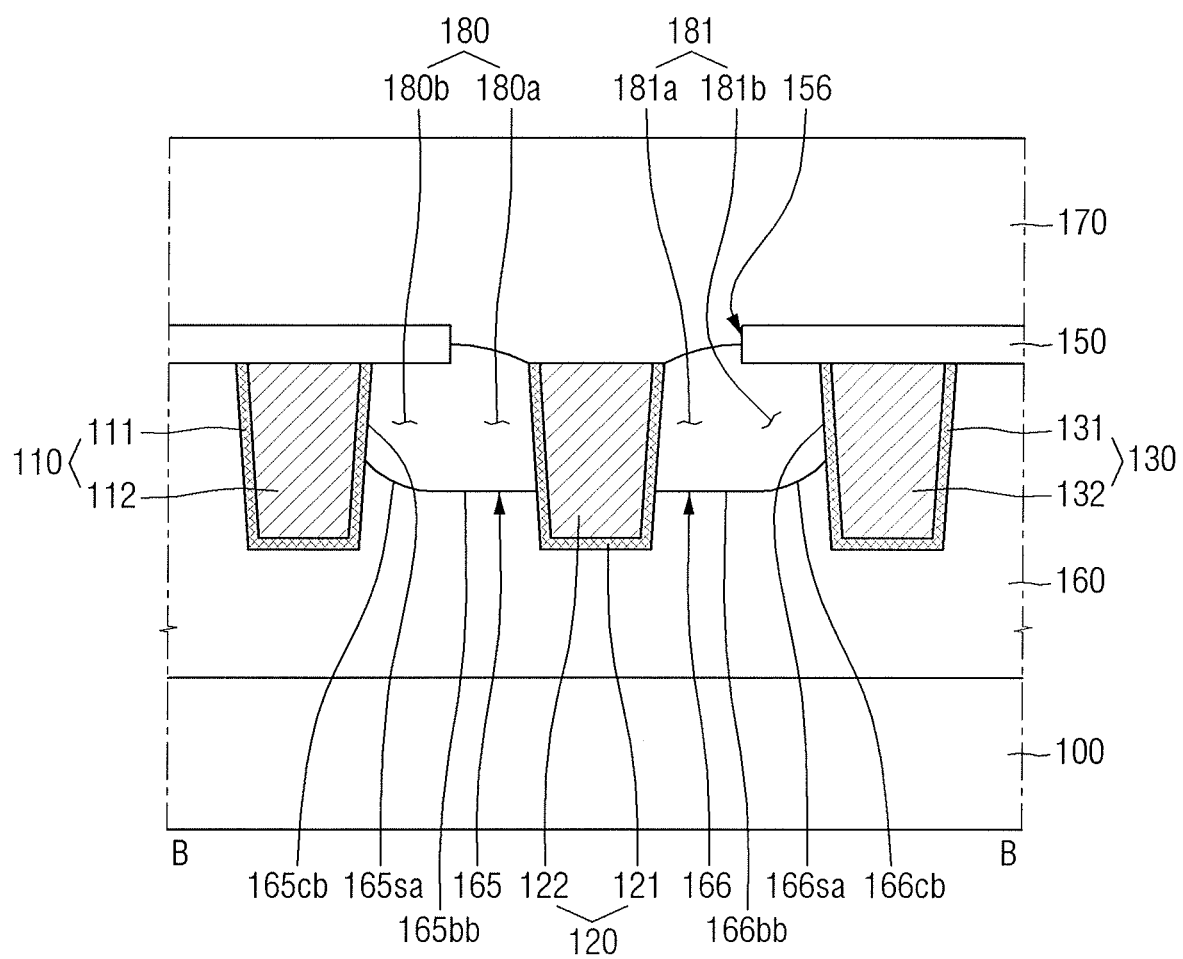
FIG. 19 illustrates a view of a semiconductor device according to some example embodiments.

FIG. 19 is a view provided to explain a semiconductor device according to some example embodiments. For convenience of explanation, differences that are not explained above with reference to FIGS. 16 to 18 will be mainly explained below.

Referring to FIG. 19, in the semiconductor device according to some example embodiments, a height of the first sidewall 165sa of the first recess defined by the first wire 110 may be less than a height of the first sidewall 165sa of the first recess defined by the second wire 120.

Further, a height of the first sidewall 166sa of the second recess defined by the third wire 130 may be less than a height of the first sidewall 166sa of the second recess defined by the second wire 120.

In a process of forming the first recess 165 and the second recess 166, the first interlayer dielectric film 160 unexposed by the first opening 156 may be removed less than the first interlayer dielectric film 160 exposed by the first opening 156. Thereby, the bottom surface of the first recess 165 connecting the first sidewall 165sa of the first recess defined by the first wire 110 and the second wire 120 may include a first portion 165bb which is substantially planar and a second portion 165cb which has a curved surface. Likewise, the bottom surface of the second recess 166 may include a first portion 166bb which is substantially planar and a second portion 166cb which has a curved surface.

Figure 20:
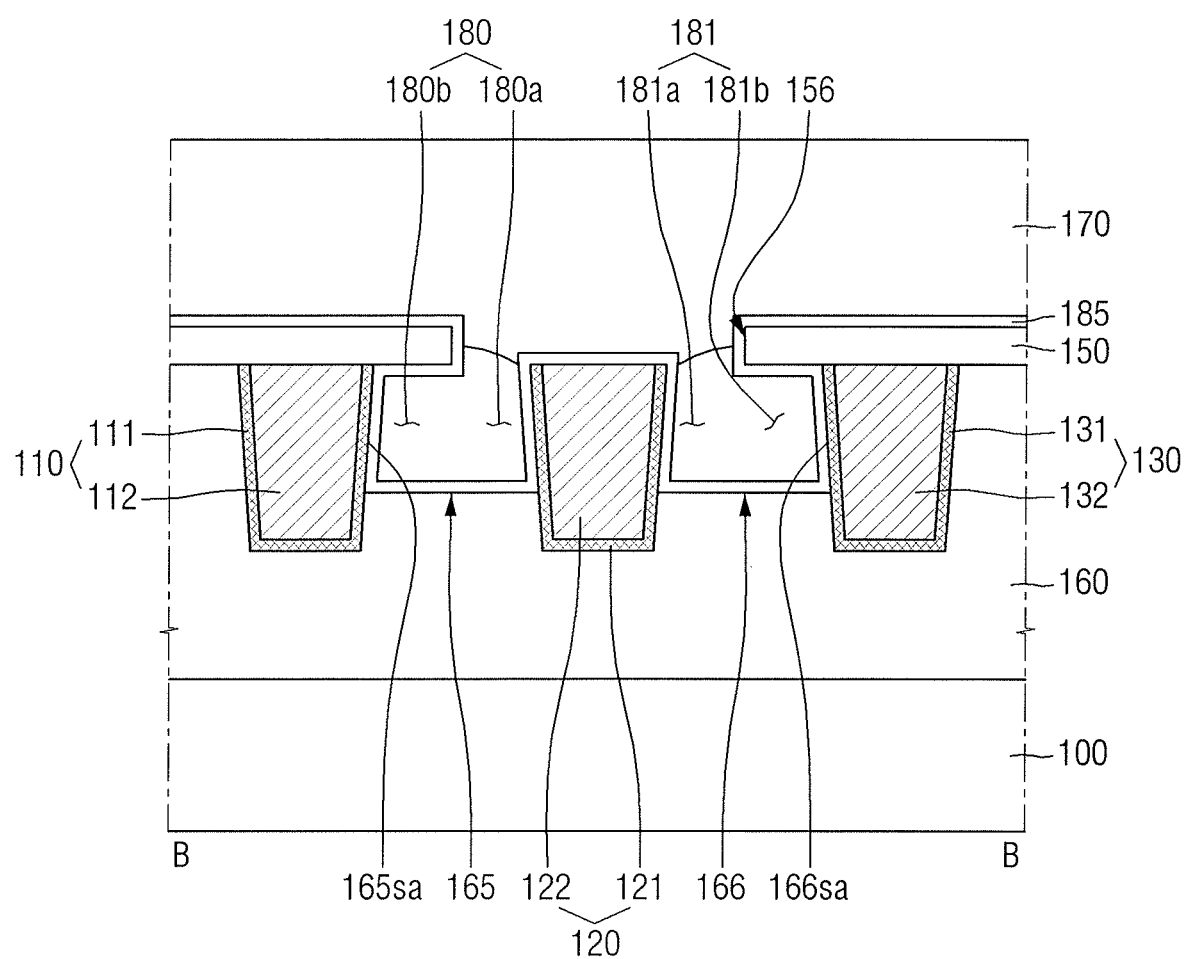
FIG. 20 illustrates a view of a semiconductor device according to some example embodiments.

FIG. 20 is a view provided to explain a semiconductor device according to some example embodiments. For convenience of explanation, differences that are not explained above with reference to FIGS. 16 to 18 will be mainly explained below.

Referring to FIG. 20, the semiconductor device according to some example embodiments may additionally include the profile of the first recess 165 and the air gap liner 185 extending along the upper surface of the first hard mask pattern 150.

At least a portion of the first air gap 180 and at least a portion of the second air gap 181 may be surrounded by the air gap liner 185, and the rest of the first air gap 180 and the rest of the second air gap 181 may be surrounded by the second interlayer dielectric film 170, but not limited hereto. According to cases, the first opening 156 between the first hard mask pattern 150 and the second wire 120 may be blocked by the air gap liner 185. In this case, the first air gap 180 and the second air gap 181 may be entirely surrounded by the air gap liner 185.

Figure 21:
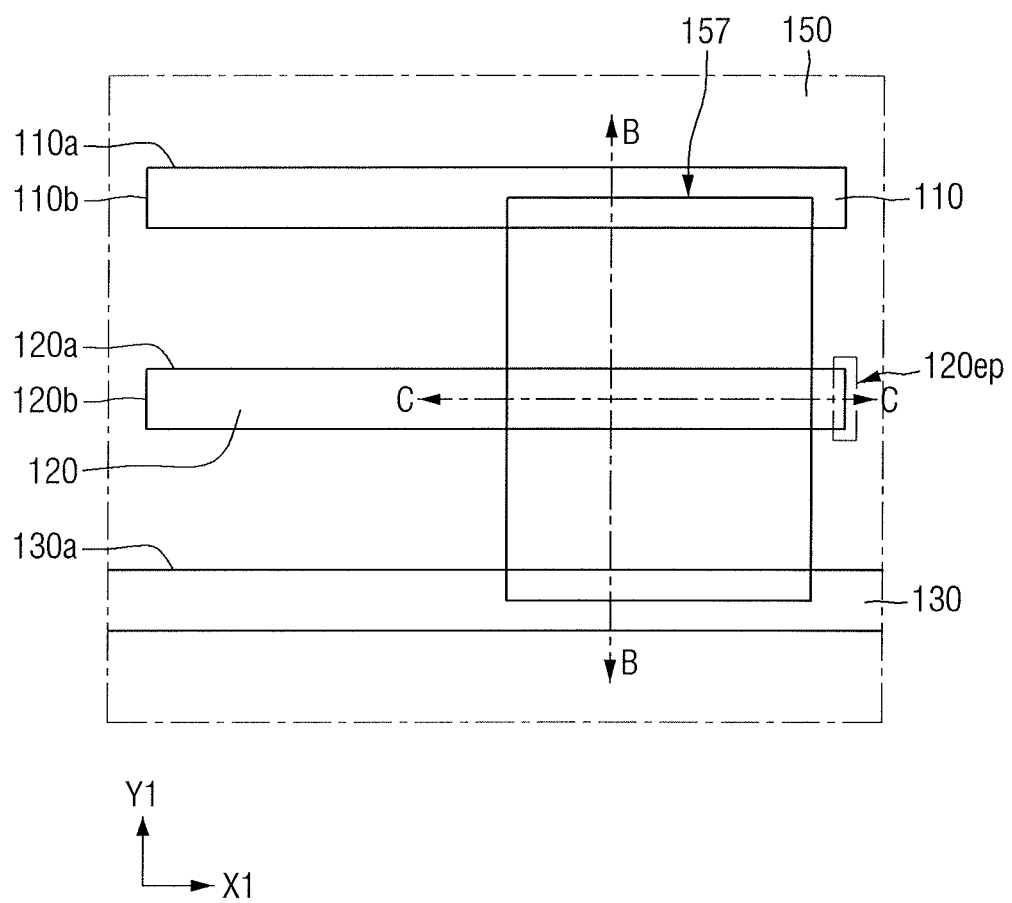
FIG. 21 illustrates a layout view of a semiconductor device according to some example embodiments.
Figure 22:
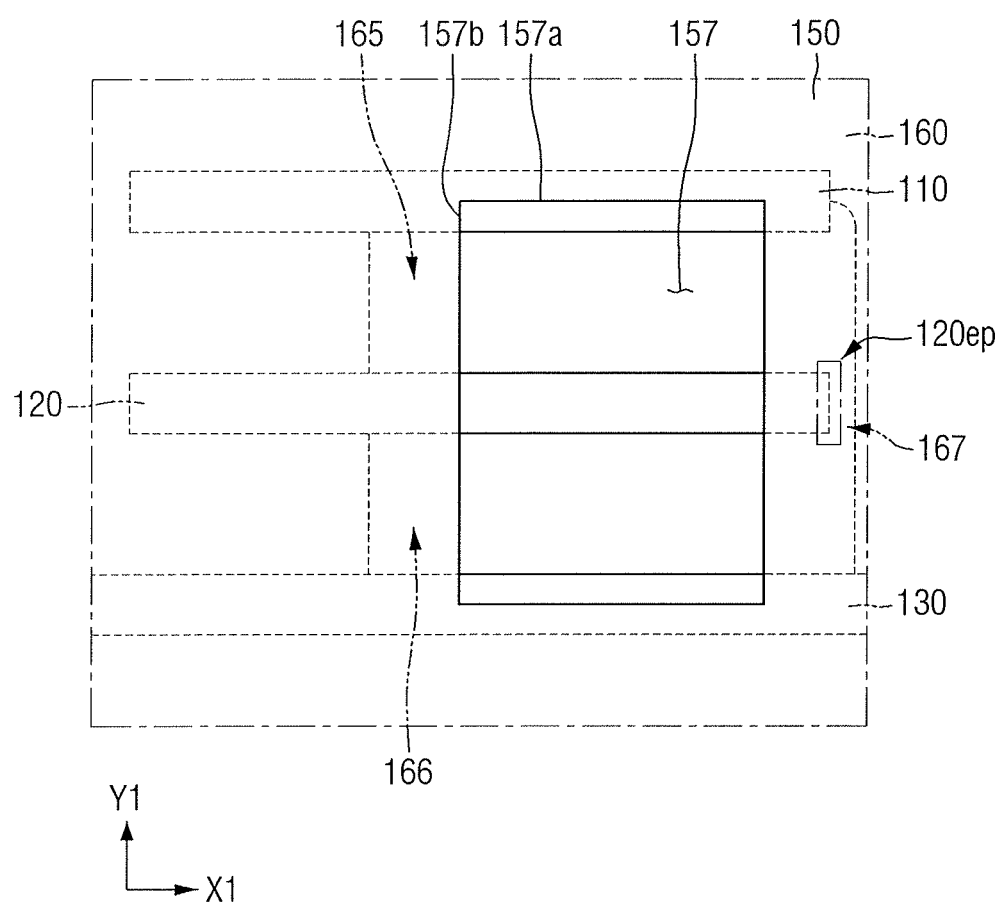
FIG. 22 illustrates a top view of the semiconductor device of FIG. 21.
Figure 23:
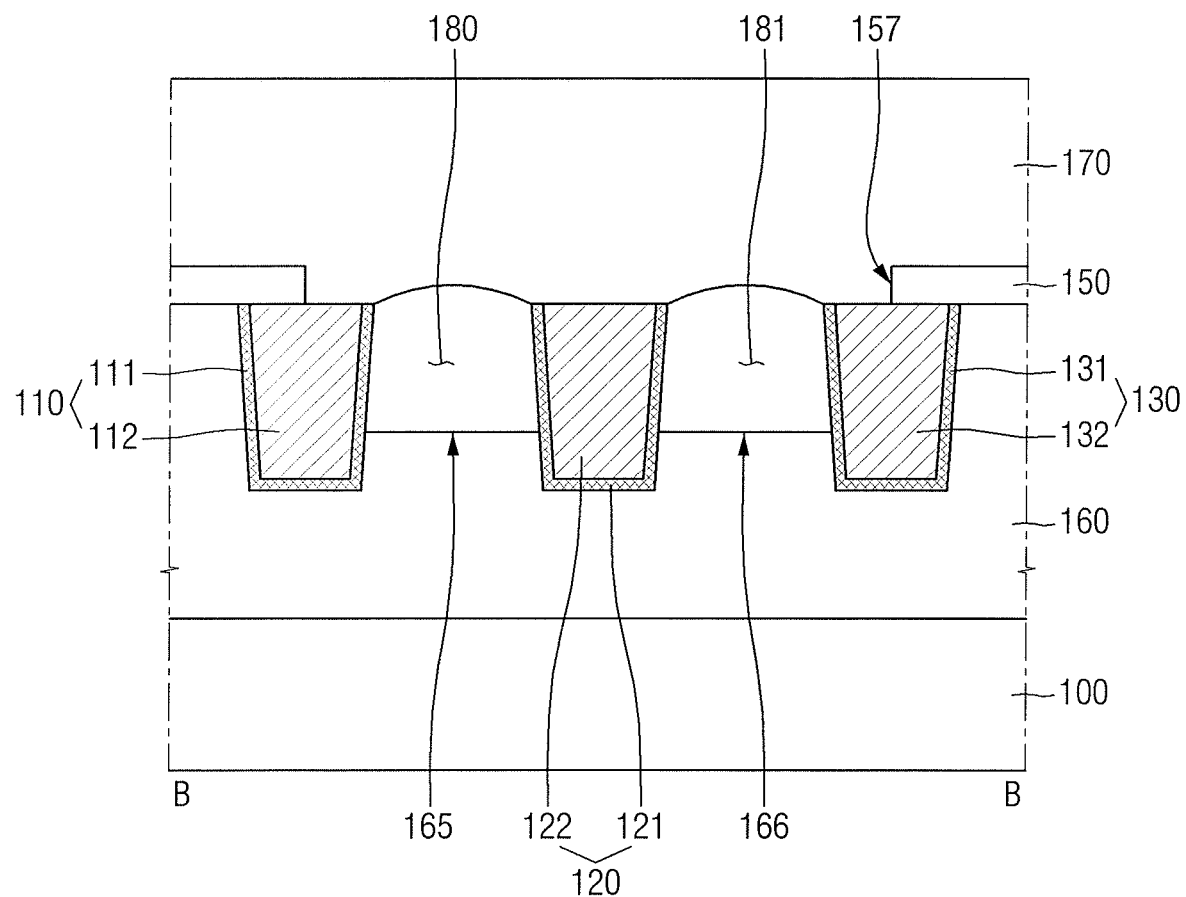
FIG. 23 illustrates a cross sectional view along line B-B of FIG. 21.
Figure 24:
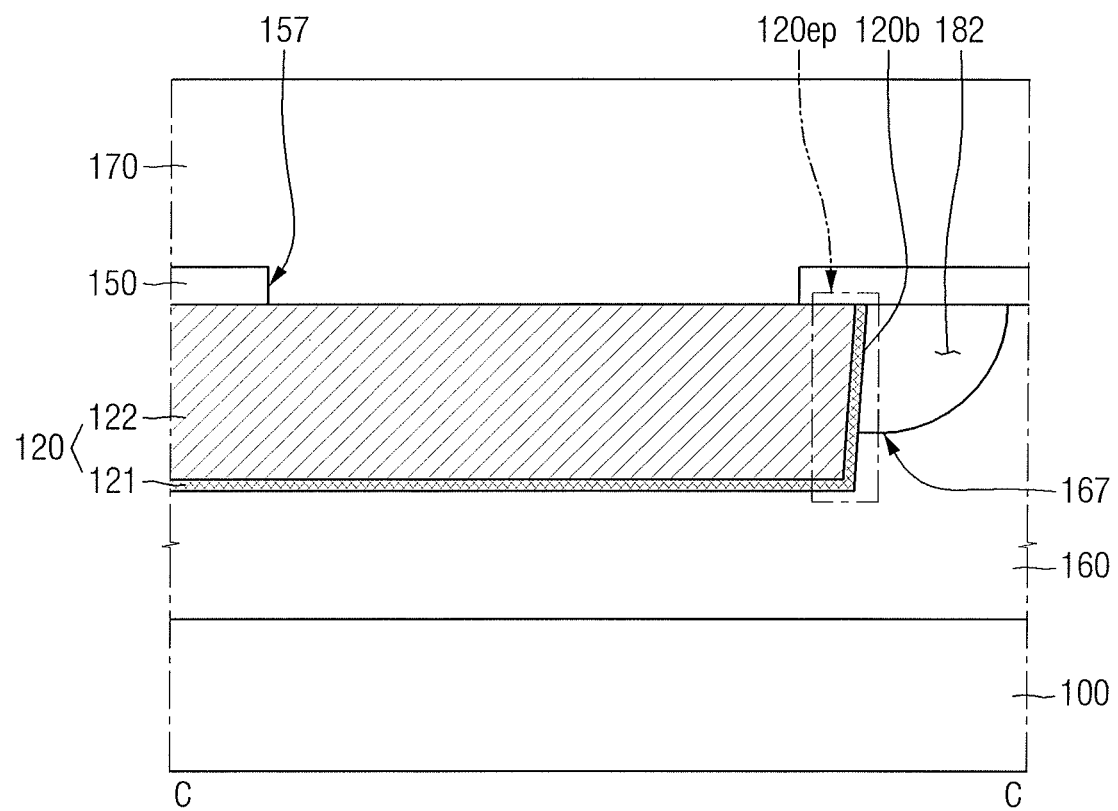
FIG. 24 illustrates a cross sectional view along line C-C of FIG. 21.

FIG. 21 is a layout view provided to explain a semiconductor device according to some example embodiments. FIG. 22 is a top view illustrating the semiconductor device of FIG. 21. FIG. 23 is a cross sectional view along line B-B of FIG. 21. FIG. 24 is a cross sectional view along line C-C of FIG. 21. For convenience of explanation, differences that are not explained above with reference to FIGS. 1 to 6 and FIGS. 16 to 18 will be mainly explained below.

Referring to FIGS. 21 to 24, the semiconductor device according to some example embodiments may further include a connection recess 167 connecting the first recess 165 and the second recess 166, and a connection air gap 182 connecting the first air gap 180 and the second air gap 181.

The first opening 157 of the first hard mask pattern 150 may vertically overlap with at least a portion of the first wire 110, at least a portion of the second wire 120, and at least a portion of the third wire 130. The first opening 157 may extend in the first direction X1 and may include first sidewalls 156a parallel to each other. The first opening 157 may include second sidewalls 157b connecting the first sidewalls 157a of the first opening.

The first sidewalls 157a of the first opening parallel to each other may be positioned on the first wire 110 and the third wire 130, but not limited hereto. As illustrated in FIG. 17, the first sidewalls 157a of the first opening may not be positioned on the first wire 110 and the third wire 130. Further, only one of the first sidewalls 157a of the first opening may be positioned on the first wire 110 or the third wire 130.

The second wire 120 may include an end portion 120ep including a short side 120b of the second wire. The first opening 157 may be adjacent to the end portion 120ep of the second wire, but may not overlap with the end portion 120ep of the second wire.

The connection recess 167 may include a sidewall and a bottom surface defined by the short side 120b of the second wire and the first interlayer dielectric film 160. The connection recess 167 may connect the first recess 165 formed between the long side 110a of the first wire and the long side 120a of the second wire with the second recess 166 formed between the long side 120a of the second wire and the long side 130a of the third wire.

Accordingly, the first recess 165, the second recess 166 and the connection recess 167 may be formed around the end portion 120ep of the second wire. In other words, at least a portion of the second wire 120 may be disposed within the first recess 165, the second recess 166, and the connection recess 167. More specifically, the end portion 120ep of the second wire may be disposed within a recess within the first interlayer dielectric film 160 formed by the first recess 165, the second recess 166, and the connection recess 167.

Because the first opening 157 may not overlap with the end portion 120ep of the second wire, the connection recess 167 may be covered by the first hard mask pattern 150. Accordingly, the connection air gap 182 may be formed between the end portion 120ep of the second wire and the first interlayer dielectric film 160. The connection air gap 182 may be disposed within the connection recess 167.

The connection air gap 182 between the end portion 120ep of the second wire and the first interlayer dielectric film 160 may connect the first air gap 180 between the first wire 110 and the second wire 120 with the second air gap 181 between the second wire 120 and the third wire 130. The first air gap 180, the second air gap 181, and the connection air gap 182, which are connected to each other, may be similar to U-shape, for example.

Figure 25:
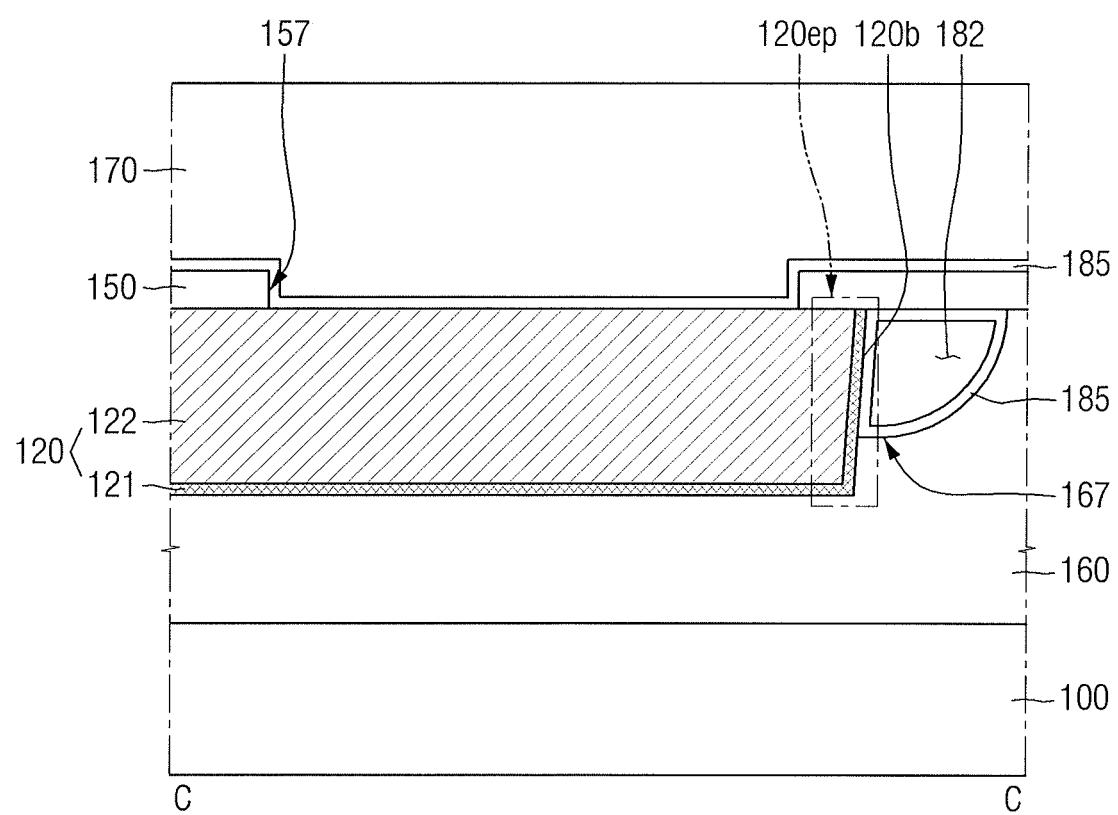
FIG. 25 illustrates a view of a semiconductor device according to some example embodiments.

FIG. 25 is a view provided to explain a semiconductor device according to some example embodiments. For convenience of explanation, differences that are not explained above with reference to FIGS. 21 to 24 will be mainly explained below.

Referring to FIG. 25, the semiconductor device according to some example embodiments may further include the air gap liner 185 extending along the profile of the first recess 165, the profile of the second recess 166 and the profile of the connection recess 167.

Further, the air gap liner 185 may be formed along the profile of the end portion 120ep of the second wire. That is, the air gap liner 185 may be formed on the short side 120b of the second wire defining the sidewall of the connection recess 167 as well as on the upper surface of the second wire 120 exposed by the first opening 157.

Unlike the illustration above, the air gap liner 185 may not be formed on at least a portion of the bottom surface of the first hard mask pattern 150 surrounding at least a portion of the sidewall and the bottom surface of the connection recess 167 and/or a portion of the connection air gap 182.

Figure 26:
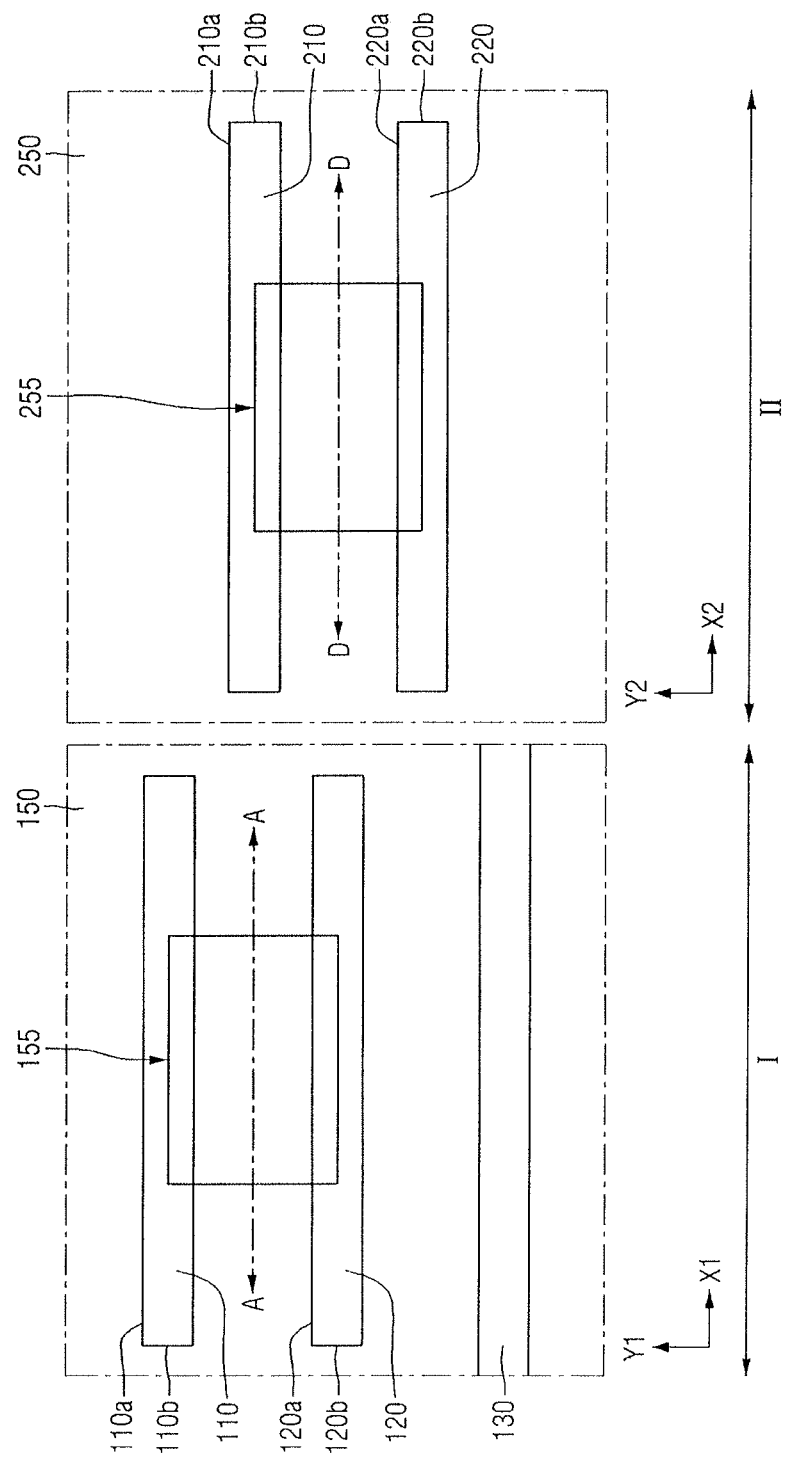
FIG. 26 illustrates a layout view of a semiconductor device according to some example embodiments.
Figure 27:
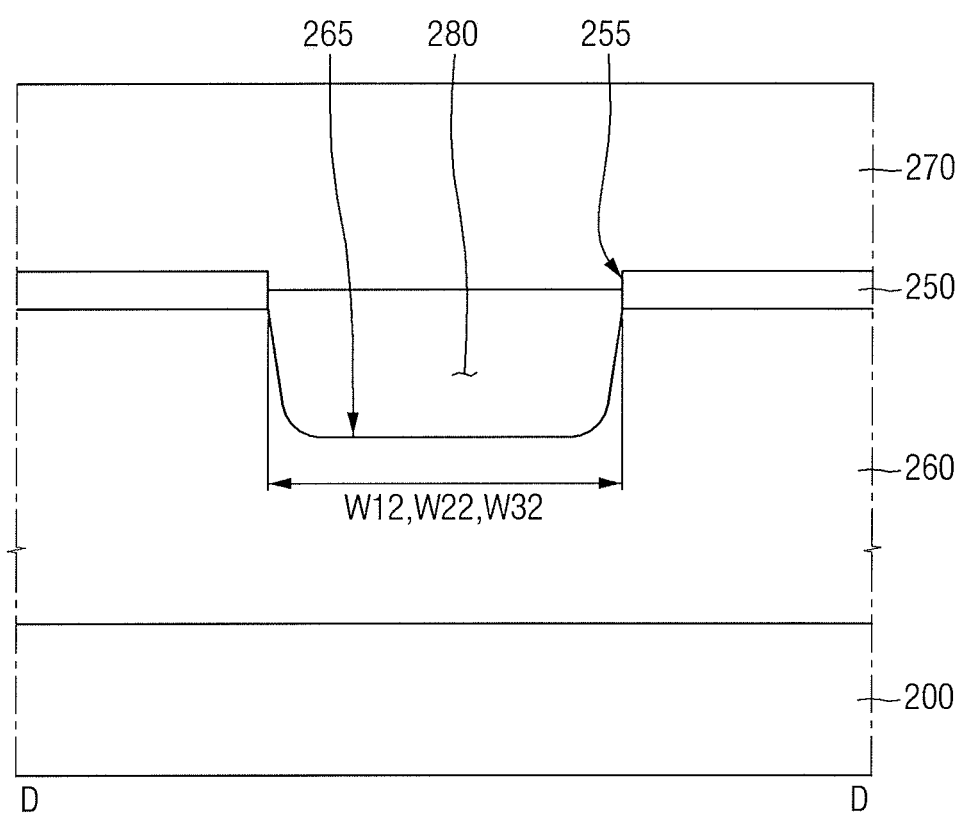
FIG. 27 illustrates a brief cross sectional view along line D-D of FIG. 26.

FIG. 26 is a layout view provided to explain a semiconductor device according to some example embodiments. FIG. 27 is a brief cross sectional view along line D-D of FIG. 26.

For reference, because a first region I of FIG. 26 may be substantially same as that described above with reference to FIGS. 1 to 6, following description will be made based on a second region II. Further, although the first region I is illustrated similarly to FIG. 1, the first region I may apparently be one of the various embodiments explained with reference to FIGS. 1 to 25.

Referring to FIGS. 26 and 27, the semiconductor device according to some example embodiments may further include a third interlayer dielectric film 260, a second hard mask pattern 250, fourth and fifth wires 210, 220, a fourth interlayer dielectric film 270, a third recess 265, and a third air gap 280.

The third interlayer dielectric film 260 of the second region II may be the second interlayer dielectric film 170 of the first region I or may be formed farther from the substrate 100 than the second interlayer dielectric film 170 of the first region I. In contrast, the fourth interlayer dielectric film 270 of the second region II may be the first interlayer dielectric film 160 of the first region I or may be formed nearer to the substrate 100 than the first interlayer dielectric film 160 of the first region I.

The following will describe the third interlayer dielectric film 260 of the second region II as a dielectric film formed at a same level as the second interlayer dielectric film 170 of the first region I. Herein, the term "same level" as used refers to being formed by a same fabricating process.

The fourth wire 210 and the fifth wire 220 may be formed within the third interlayer dielectric film 260 of the second region II. The fourth wire 210 and the fifth wire 220 may extend longitudinally in a third direction X2. Further, the fourth wire 210 and the fifth wire 220 may be adjacent to each other in a fourth direction Y2.

The fourth wire 210 and the fifth wire 220 may include long sides 210a, 220a extending in the third direction X2 and short sides 210b, 220b extending in the fourth direction Y2. The long side 210a of the fourth wire may face the long side 220a of the fifth wire.

The third recess 265 may be formed within the third interlayer dielectric film 260. The third recess 265 may be formed between the long side 210a of the fourth wire and the long side 220a of the fifth wire.

The second hard mask pattern 250 may be formed on the third interlayer dielectric film 260. The second hard mask pattern 250 may be formed on the fourth and fifth wires 210, 220. The second hard mask pattern 250 may include a second opening 255. The second opening 255 may expose at least a portion of the fourth and fifth wires 210, 220.

The fourth interlayer dielectric film 270 may be formed on the second hard mask pattern 250. The fourth interlayer dielectric film 270 may block the second opening 255.

The third air gap 280 may be formed within the third interlayer dielectric film 260. The third air gap 280 may be formed between the third interlayer dielectric film 260 and the fourth interlayer dielectric film 270 as the second opening 255 is blocked by the fourth interlayer dielectric film 270.

Further, in the semiconductor device according to some example embodiments, the width W12 of the third recess 265 in the third direction X2 may be substantially equal to the width W22 of the second opening 255 in the third direction X2.

Further, when the air gap liner or the like is not formed, the width W12 of the third recess 265 in the third direction X2 may be substantially equal to the width W32 of the third air gap 280 in the third direction X2.

FIGS. 28 to 33B are views illustrating intermediate stages of fabrication, provided to explain a method for fabricating a semiconductor device according to some example embodiments. FIGS. 29B and 29C are cross sectional views along lines A-A and B-B of FIG. 29A, respectively. Further, FIGS. 30A, 31A, 32A, and 33A are cross sectional views along line A-A of FIG. 29A, respectively, and FIGS. 30B, 31B, 32B and 33B are cross sectional views along line B-B of FIG. 29A, respectively.

Figure 28:
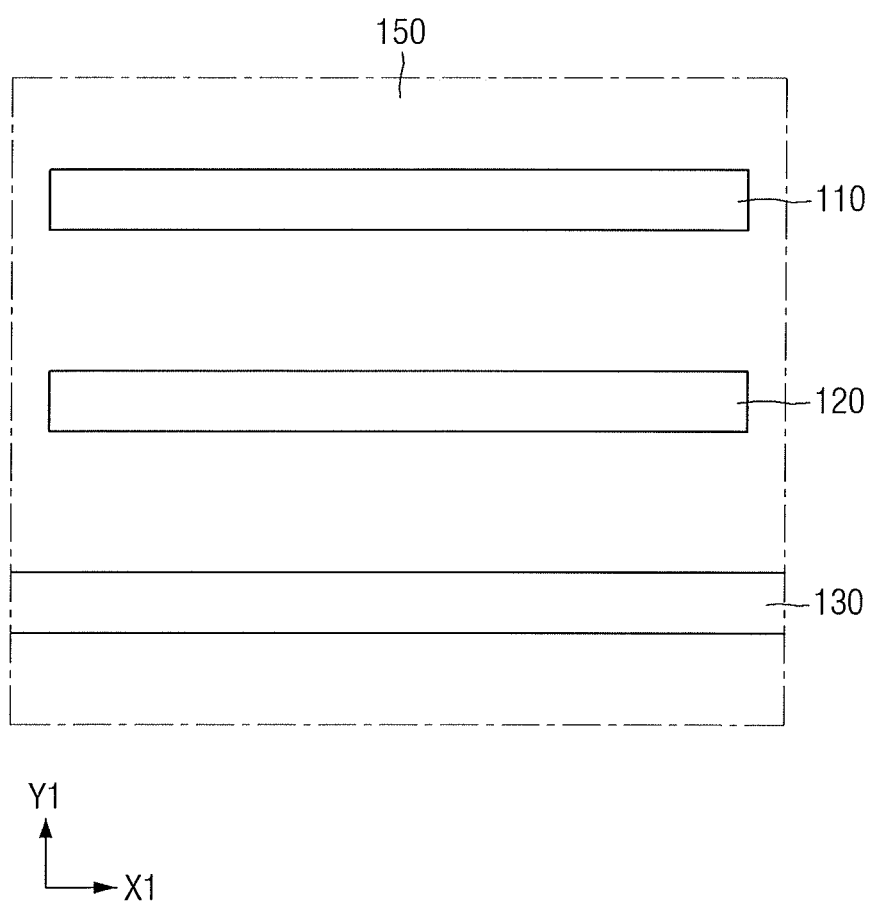
FIGS. 28, 29A-29C, 30A, 30B, 31A, 31B, 32A, 32B, 33A, and 33B illustrate views of intermediate stages in a method for fabricating a semiconductor device according to some example embodiments.

Referring to FIG. 28, after forming the first interlayer dielectric film 160 on the substrate 100, the first to third wires 110, 120, 130 respectively extending in the first direction X1 may be formed within the first interlayer dielectric film 160. The first to third wires 110, 120, 130 may be formed adjacently in the second direction Y1. For example, the first to third wires 110, 120, 130 may be formed by making opening in the first interlayer dielectric film 160, followed by forming the first to third wires 110, 120, 130 in the openings.

Figure 29A:
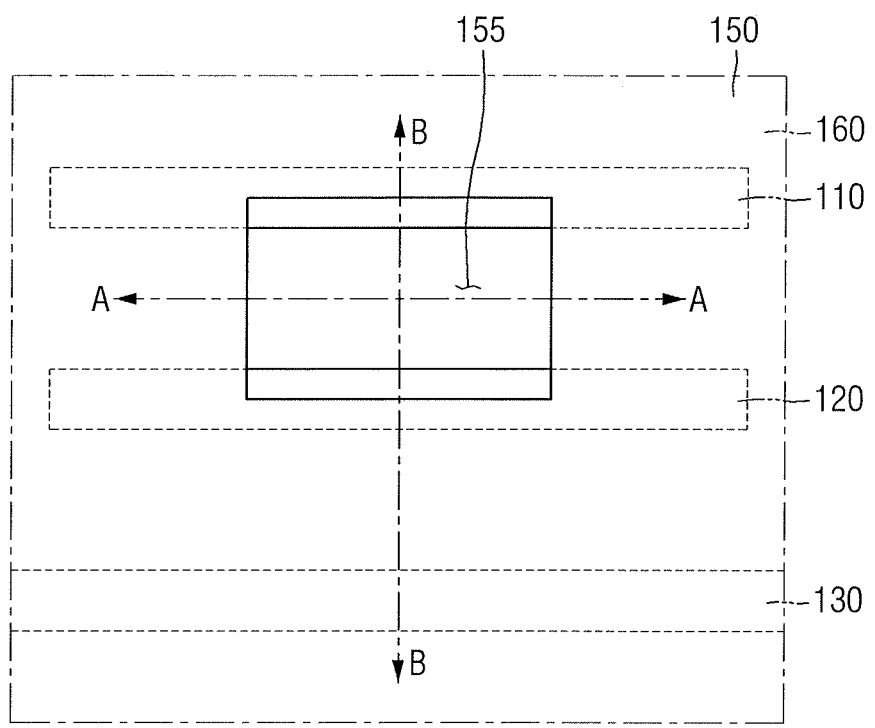
Figure 29A:
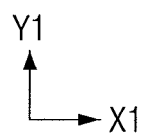
Figure 29B:
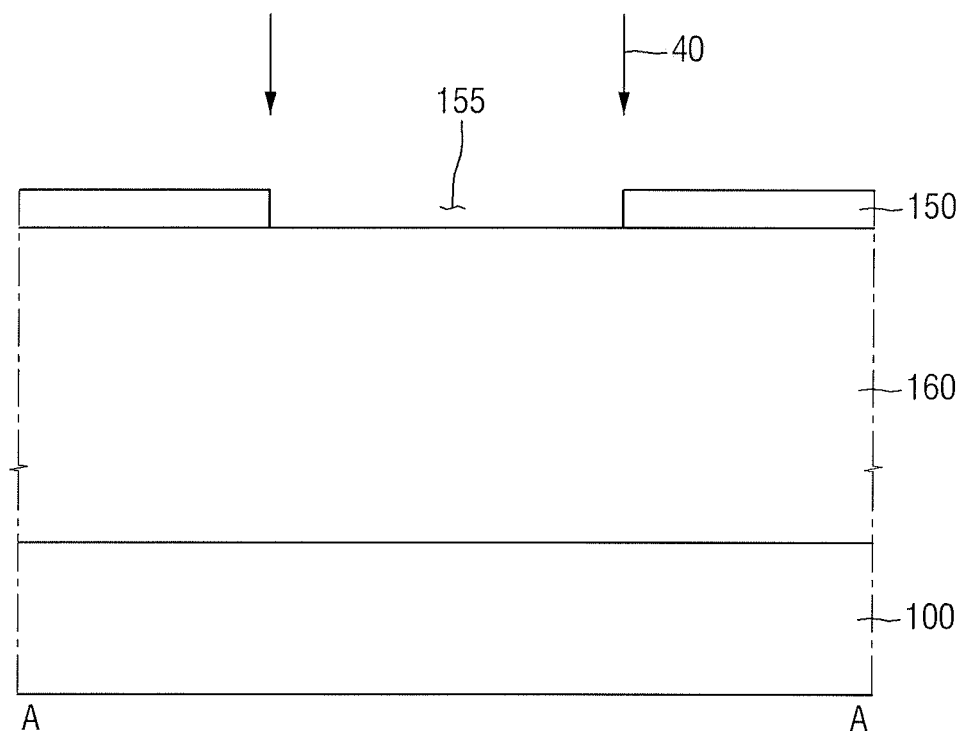
Figure 29C:
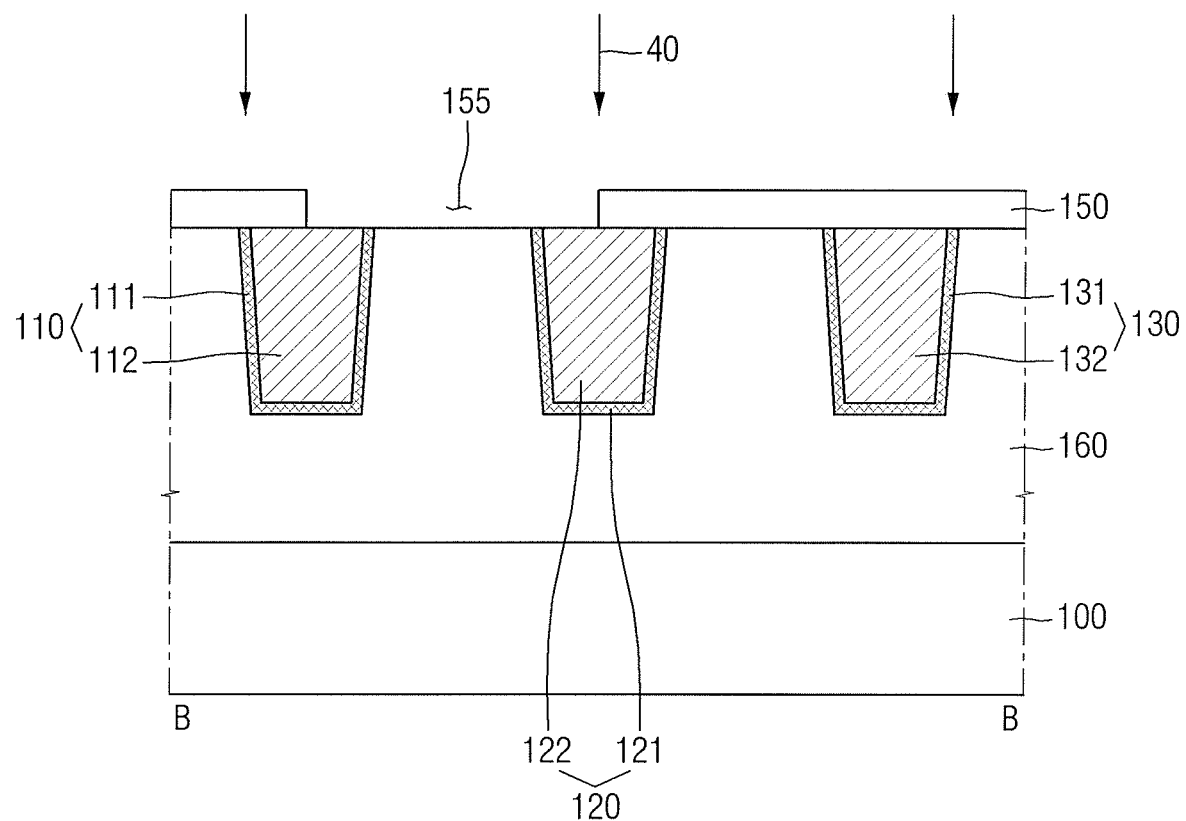

Next, referring to FIGS. 29A to 29C, the first hard mask pattern 150 may be formed on the first interlayer dielectric film 160. The first hard mask pattern 150 may include a first opening 155. The first opening 155 may expose at least a portion of the first interlayer dielectric film 160 between the first wire 110 and the second wire 120.

The first hard mask pattern 150 may be formed with a dry etch process 40. Even when the dry etch process of forming the first hard mask pattern 150 is performed, the sidewall of the first wire 110 and the sidewall of the second wire 120 may not be exposed.

Figure 30A:
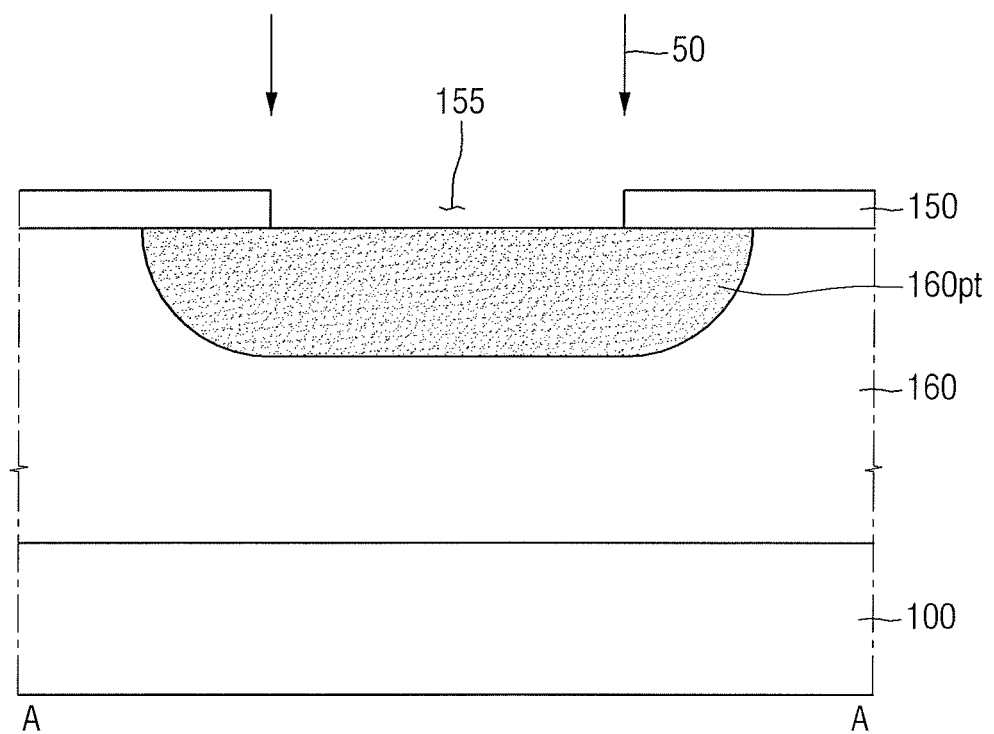
Figure 30B:
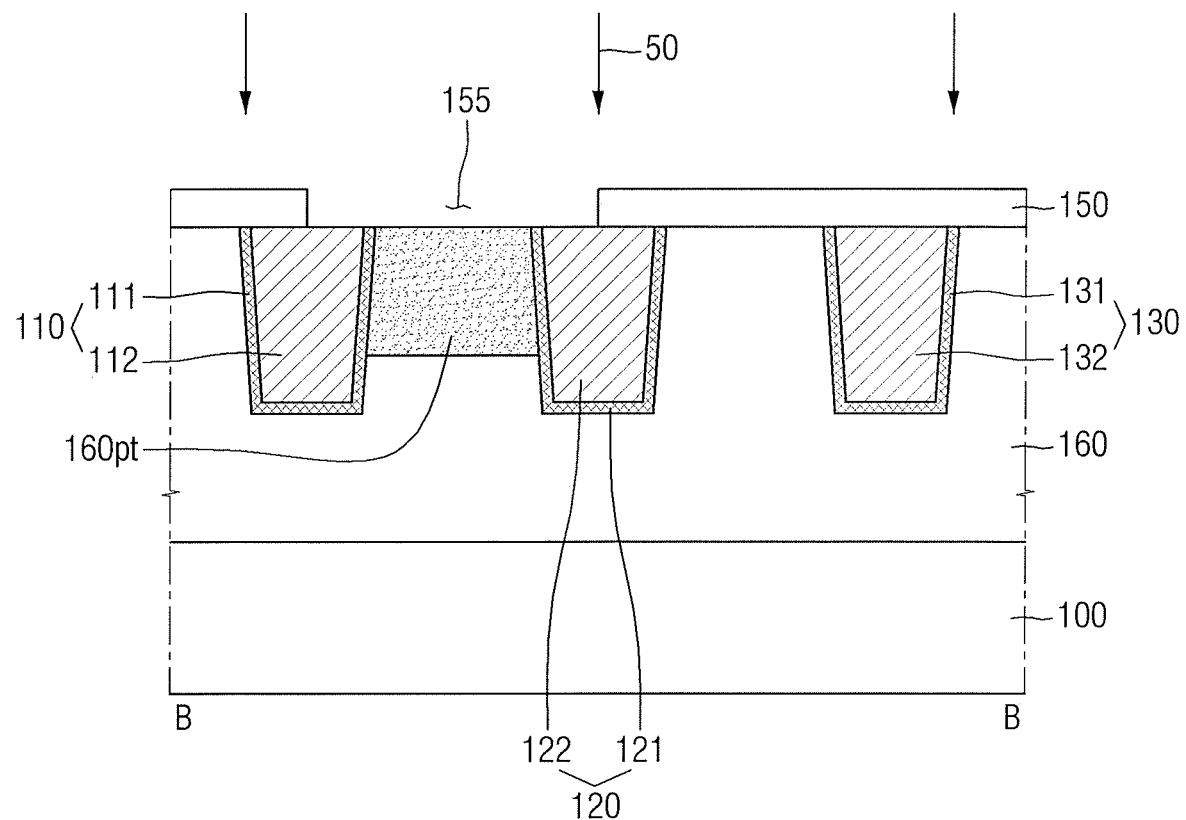

Next, referring to FIGS. 30A and 30B, a plasma treatment process 50 may be performed with respect to the first interlayer dielectric film 160 exposed by the first opening 155 by using the first hard mask pattern 150 as a mask. As a result, a plasma treatment region 160pt may be formed within the first interlayer dielectric film 160. Compared to other regions of the first interlayer dielectric film 160, the plasma treatment region 160pt may have a lower carbon concentration. That is, the plasma treatment region 160pt may be a carbon depletion region.

The plasma treatment process 50 may be performed by using gas containing, e.g., ammonia ($NH_3$). The plasma treatment process 50 may be an isotropic plasma treatment process. Accordingly, the isotropic plasma treatment process causes a portion of the first interlayer dielectric film 160 under the first hard mask pattern 150, i.e., a portion of the first interlayer dielectric film 160 not overlapping vertically with the first opening 155, also to be plasma-treated by the plasma treatment process 50, e.g., as compared to a plasma-treated region via an anisotropic plasma process that includes only a region overlapping an opening.

A depth of the plasma treatment region 160pt may be less than or equal to the height of the first wire 110 and the height of the second wire 120. Further, because the plasma treatment process 50 is an isotropic plasma treatment process, a depth of the plasma treatment region 160pt may be substantially equal to a width of the plasma treatment region 160pt not overlapping with the first opening 155.

Figure 31A:
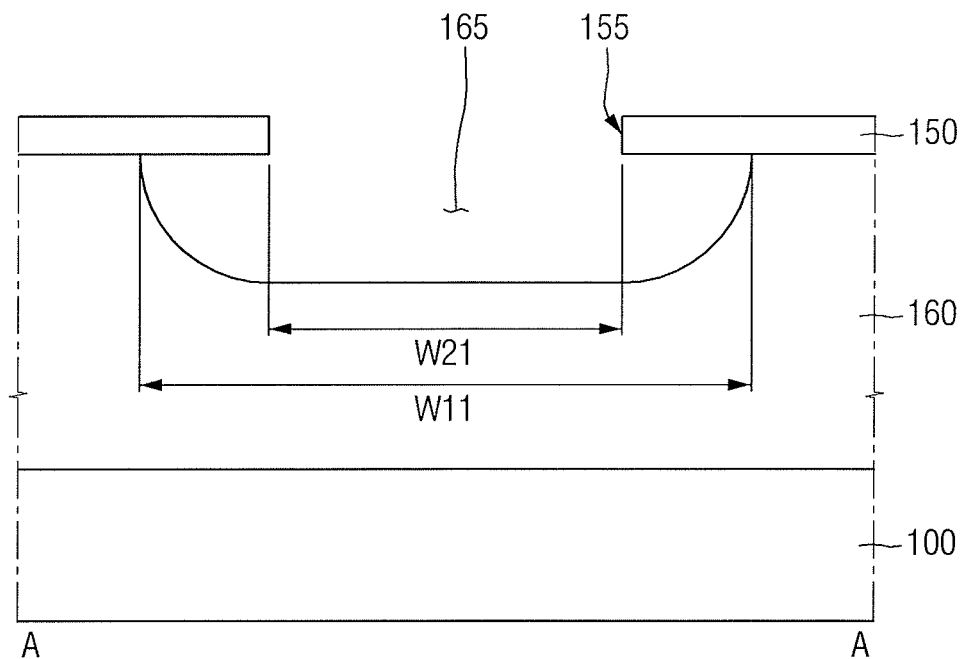
Figure 31B:
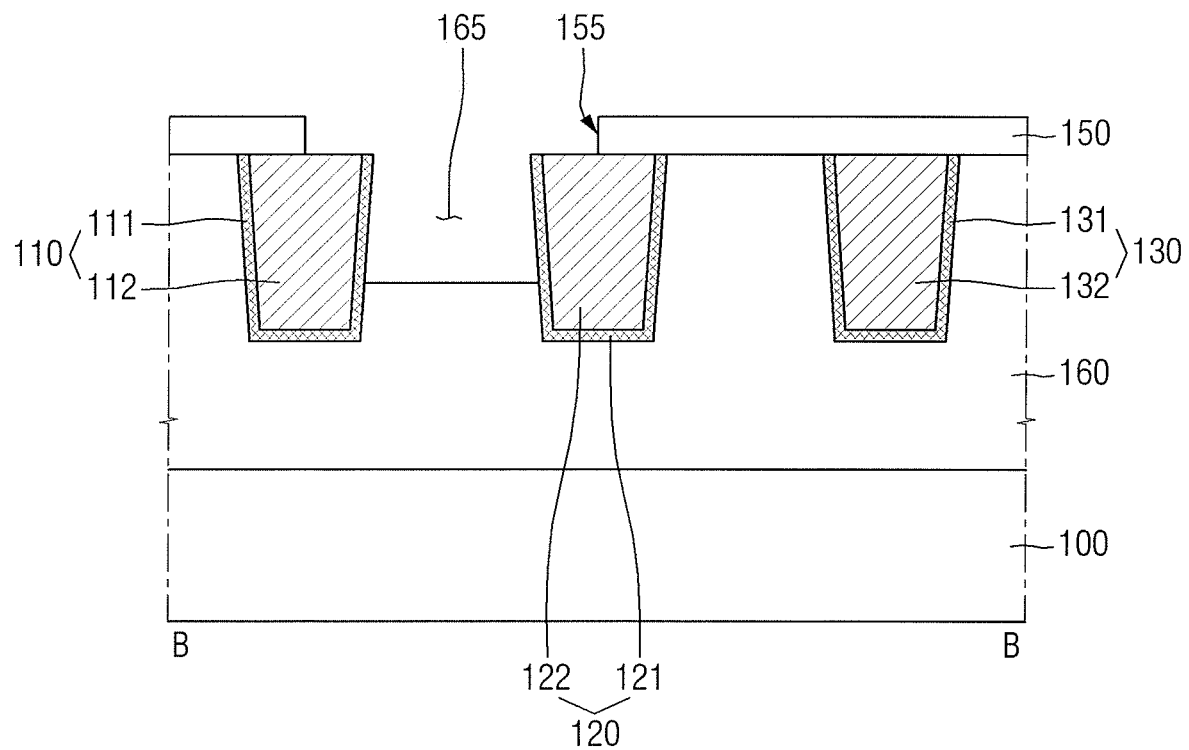

Referring to FIGS. 31A and 31B, the first recess 165 may be formed within the first interlayer dielectric film 160 by removing the plasma-treated first interlayer dielectric film 160. The first recess 165 may be formed by removing the plasma treatment region 160pt. The plasma treatment region 160pt may be removed, e.g., by using wet etching. The wet etching may use etchant including, e.g., hydrofluoric acid (HF). As the plasma-treated first interlayer dielectric film 160 includes a portion of the first interlayer dielectric film 160 under the first hard mask pattern 150, the width WI 1 of the first recess 165 in the first direction X1 is greater than the width W21 of the first opening 155 in the first direction X1.

Figure 32A:
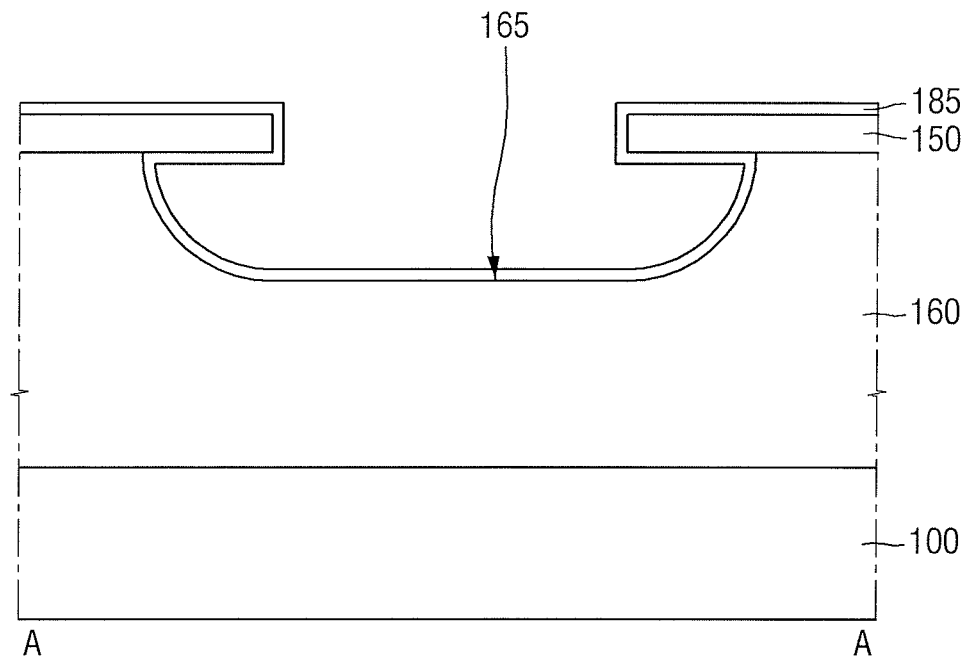
Figure 32B:
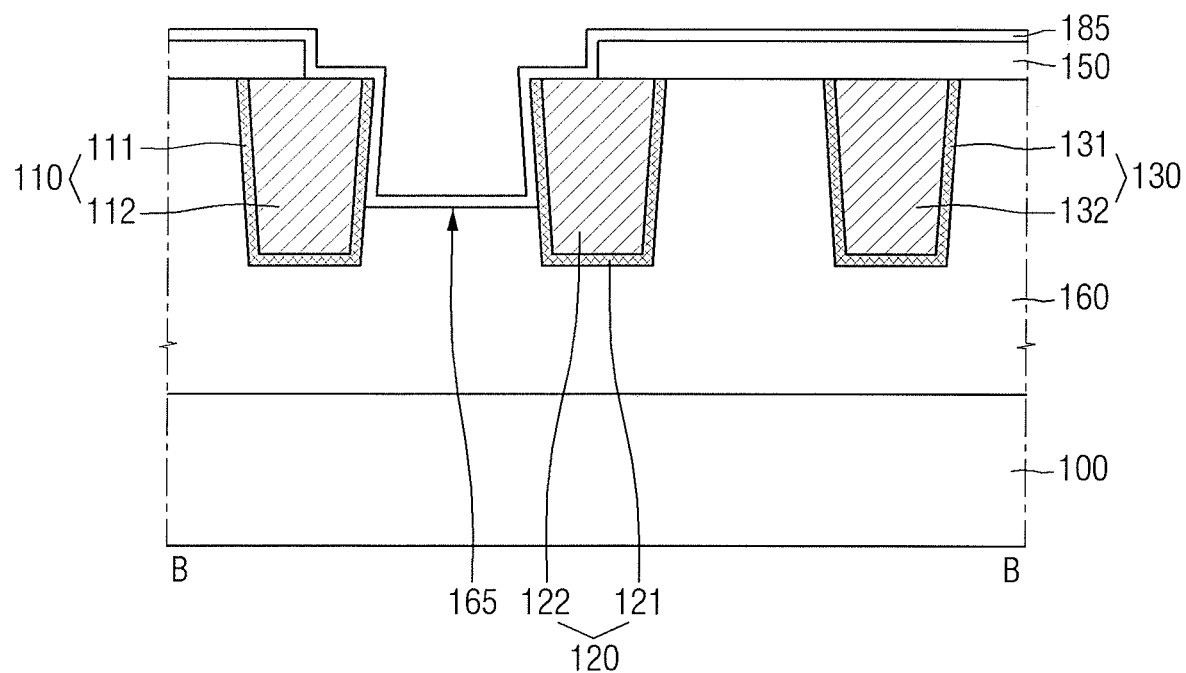

Referring to FIGS. 32A and 32B, the air gap liner 185 may be formed along the profile of the first recess 165. The air gap liner 185 may be formed along the upper surface of the first hard mask pattern 150, the upper surface of the first wire 110 exposed by the first opening 155, and the upper surface of the second wire 120 exposed by the first opening 155.

A process of forming the air gap liner 185 may be a selective process. Accordingly, subsequent process may be performed without forming the air gap liner 185.

Figure 33A:
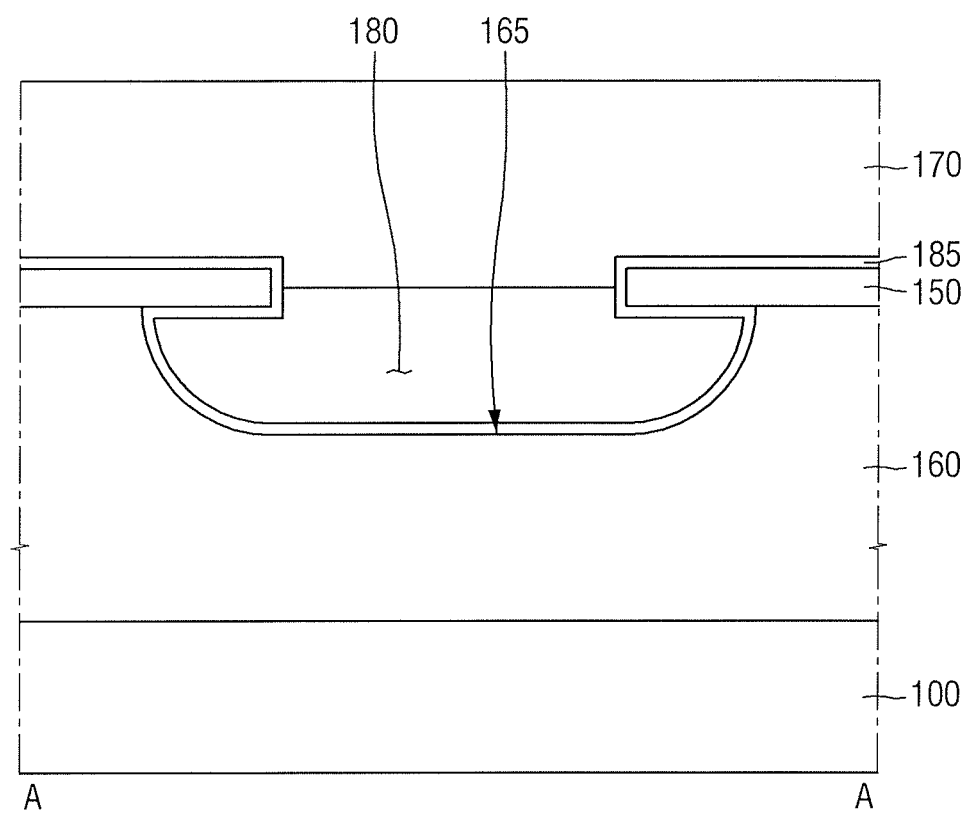
Figure 33B:
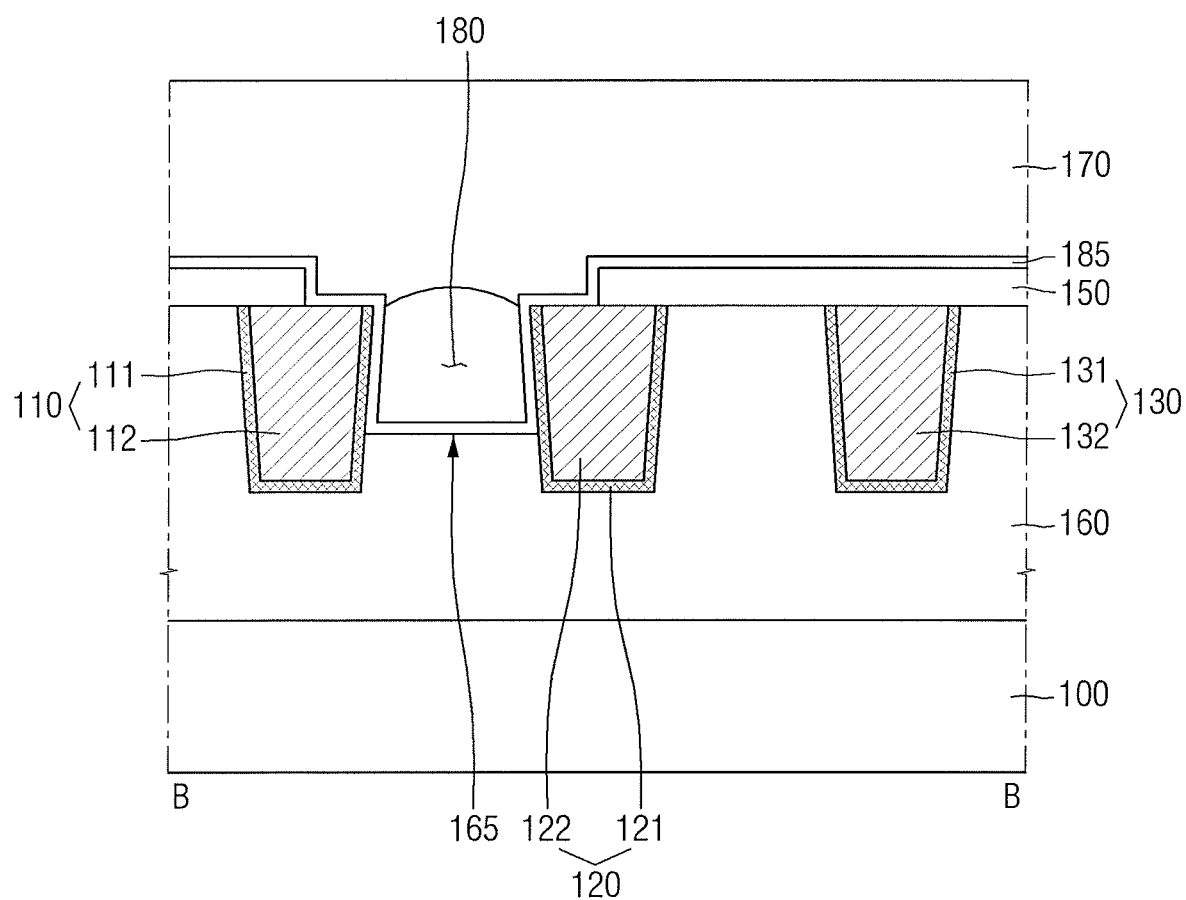

Referring to FIGS. 33A and 33B, the second interlayer dielectric film 170 may be formed on the air gap liner 185. The second interlayer dielectric film 170 may be formed on the first hard mask pattern 150. The second interlayer dielectric film 170 may block, e.g., completely overlap, the first opening 155 where the air gap liner 185 is formed. As a result, the first air gap 180 may be formed within the first recess 165, e.g., the first air gap 180 may be enclosed by the first recess 165 and the second interlayer dielectric film 170.

Figure 34A:
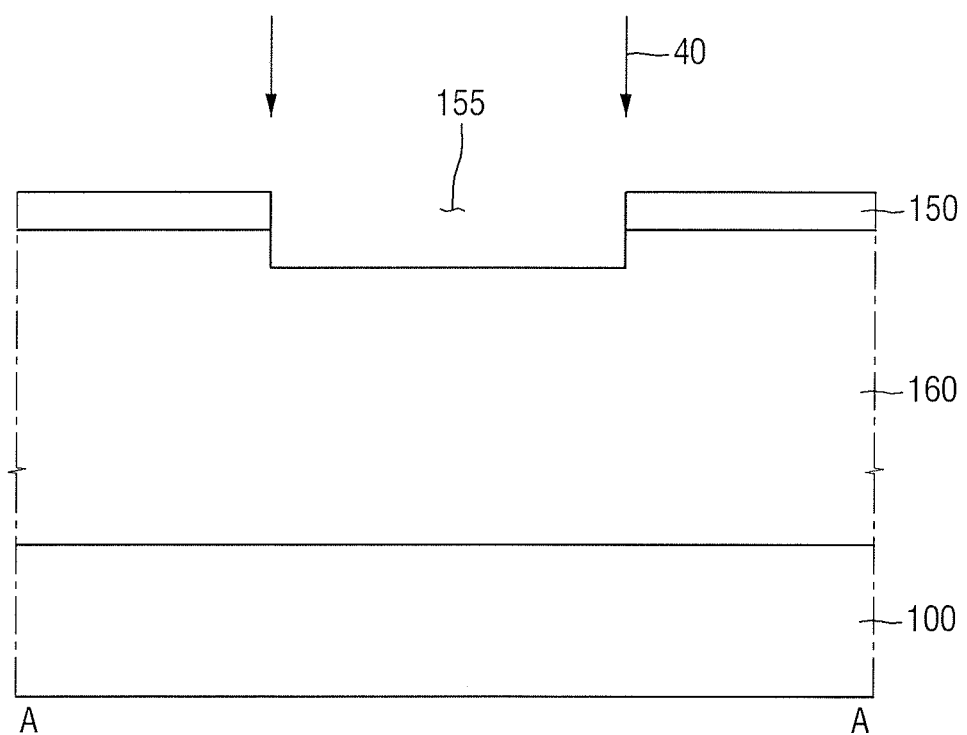
FIGS. 34A, 34B, and 35 illustrate views of intermediate stages in a method of fabricating a semiconductor device according to some example embodiments.
Figure 34B:
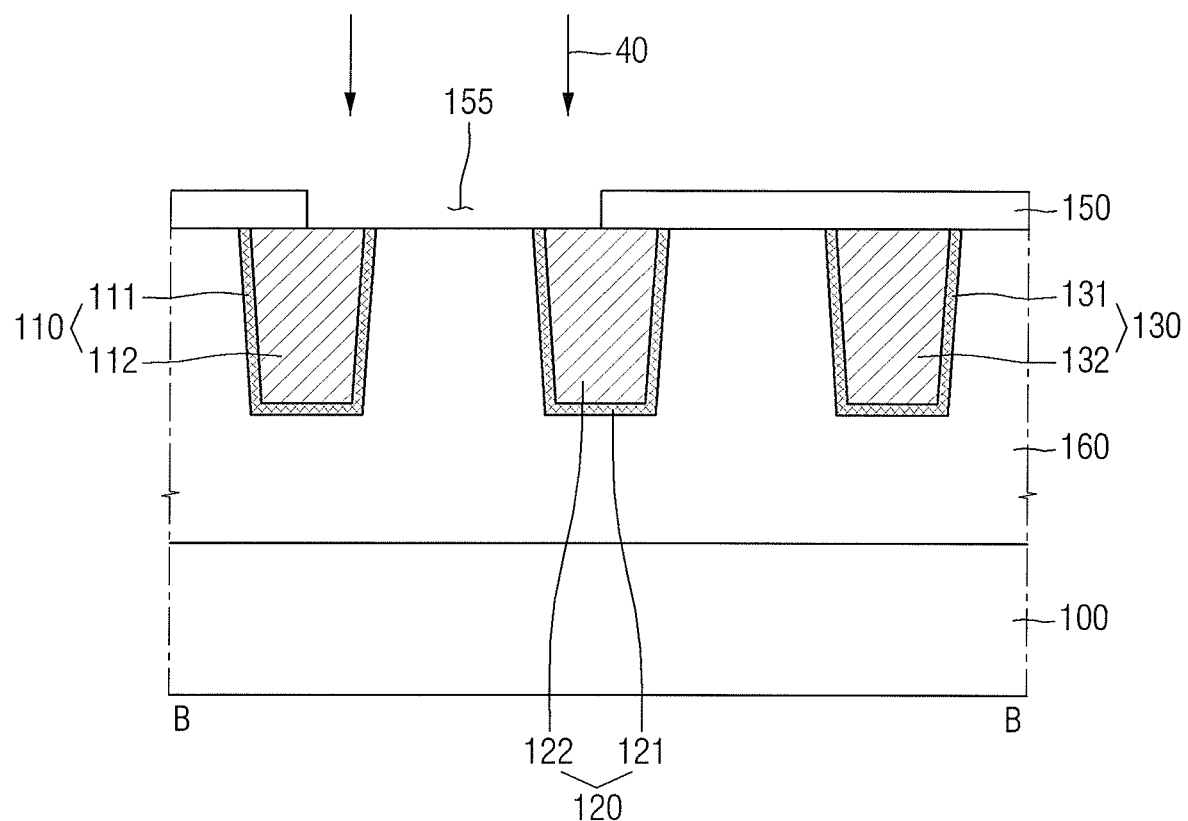
Figure 35:
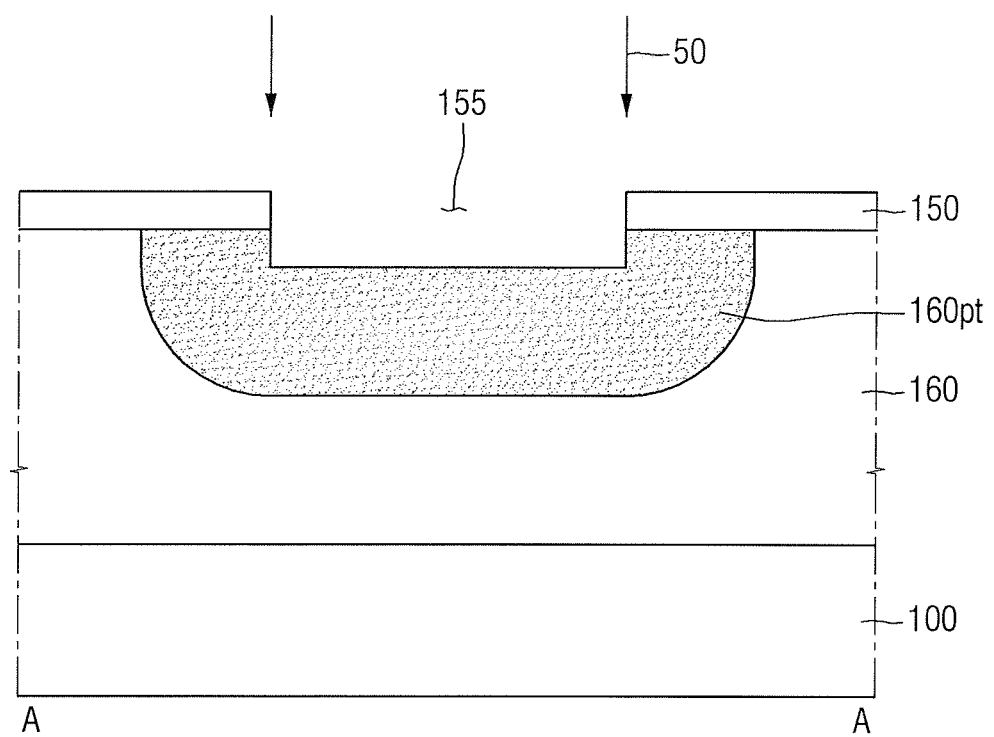

FIGS. 34A to 35 are views illustrating intermediate stages of fabrication, provided to explain a method of fabricating a semiconductor device according to some example embodiments. FIGS. 34A and 34B may be the views of a fabrication process which is performed after FIGS. 29A to 29C. Further, FIG. 34A is a cross sectional view along line A-A of FIG. 29A, and FIG. 34B is a cross sectional view along line B-B of FIG. 29A.

Referring to FIGS. 34A and 34B, a portion of the first interlayer dielectric film 160 between the first wire 110 and the second wire 120 may be removed while the first hard mask pattern 150 is being formed by the dry etch process 40. That is, while the first hard mask pattern 150 is being formed by the dry etch process 40, a portion of the sidewall of the first wire 110 and a portion of the sidewall of the second wire 120 may be exposed.

Referring to FIG. 35, with a portion of the sidewall of the first wire 110 and a portion of the sidewall of the second wire 120 being exposed, the plasma treatment process 50 may be performed on the first interlayer dielectric film 160 exposed by the first opening 155. Because the isotropic plasma treatment process 50 is performed with a portion of the first interlayer dielectric film 160 being removed, the depth of the plasma treatment region 160pt may be greater than the width of the plasma treatment region 160pt not overlapping the first opening 155.

By way of summation and review, embodiments provide a semiconductor device that can enhance performance and reliability of a semiconductor device by forming an intermetal dielectric film including an air gap between wires. Embodiments also provide a method for fabricating a semiconductor device that can enhance reliability and performance of a semiconductor device by minimizing loss and damage of metal wires in a process of forming an air gap in the intermetal dielectric film.

That is, a recess for an air gap is formed in an undercut region under adjacent metal wires. The undercut region is formed by an isotropic plasma treatment, followed by wet etching of the intermetal dielectric (IMD) layer, to define the undercut region under the metal wires. Accordingly, damage to and loss of the metal wiring, as well as increased resistance, may be minimized, e.g., as compared to dry etching following anistropic plasma that may wear tops of the metal wires and cause wiring loss and increased resistance. In addition, since the IMD layer is removed by an isotropic plasma treatment, followed by wet etching, to define the undercut region under the metal wires, the area of the metal wiring exposed during the etching process is minimized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
a first interlayer dielectric film on the substrate;
first and second wires respectively extending in a first direction within the first interlayer dielectric film, the first and second wires being adjacent to each other in a second direction different from the first direction;
a hard mask pattern on the first interlayer dielectric film, the hard mask pattern including an opening; and
an air gap within the first interlayer dielectric film, the air gap including a first portion overlapping vertically with the opening and a second portion not overlapping with the opening in the first direction,
wherein the second portion of the air gap includes a region not overlapping with the opening in the second direction, the first portion of the air gap being adjacent to the first wire, and the second portion of the air gap being positioned between the first portion of the air gap and the second wire, and
wherein the hard mask pattern overhangs a portion of the air gap, while exposing portions of tops of the first and second wires.

2. The semiconductor device as claimed in claim 1, wherein the first interlayer dielectric film includes a low-k dielectric material having a smaller dielectric constant than silicon oxide.

3. The semiconductor device as claimed in claim 1, further comprising a recess within the first interlayer dielectric film, at least a portion of the air gap being in the recess,
wherein the air gap is within the first interlayer dielectric film between the first wire and the second wire, a width of the air gap in the first direction being greater than a width of the opening in the first direction, and
wherein the recess includes a first portion vertically overlapping with the opening and a second portion not overlapping with the opening, and the second portion of the recess is on opposite sides of the first portion of the recess.

4. The semiconductor device as claimed in claim 1, further comprising a recess within the first interlayer dielectric film, at least a portion of the air gap being within the recess, and the hard mask pattern including a protruding portion which protrudes laterally from an uppermost portion of the recess farther than a sidewall of the recess;
an air gap liner extending along a profile of the recess and along a profile of the protruding portion of the hard mask pattern; and
an insulating pattern on the air gap liner, the insulating pattern extending along a portion of the profile of the recess.

5. A semiconductor device, comprising:
a substrate;
a first interlayer dielectric film on the substrate;
first and second wires extending respectively in a first direction within the first interlayer dielectric film, the first and second wires being adjacent to each other in a second direction different from the first direction;
a first recess within the first interlayer dielectric film between the first and second wires, the first recess including a sidewall defined by the first and second wires;
a first hard mask pattern on the first interlayer dielectric film, the first hard mask pattern including a first opening overlapping with a portion of the first recess, with a portion of the first wire, and with a portion of the second wire; and
an air gap within the first recess, the first hard mask pattern overhanging a portion of the air gap, while exposing portions of tops of the first and second wires,
wherein a width of the first recess in the first direction is greater than a width of the first opening in the first direction,
wherein the first wire includes a filling conductive film and a barrier conductive film extending along a bottom surface and a sidewall of the filling conductive film,
wherein the first wire includes a first portion overlapping with the first opening and a second portion not overlapping with the first opening,
wherein a height of the barrier conductive film at the first portion of the first wire is equal to or less than a height of the barrier conductive film at the second portion of the first wire, and
wherein the barrier conductive film includes a portion protruding upward higher than an upper surface of the filling conductive film, at a location where the upper surface of the filling conductive film at the second portion of the first wire meets the barrier conductive film.

6. The semiconductor device as claimed in claim 5, wherein the first wire further comprises a capping conductive film on an upper surface of the filling conductive film, and
wherein a thickness of the capping conductive film at the first portion of the first wire is less than a thickness of the capping conductive film at the second portion of the first wire.

7. The semiconductor device as claimed in claim 5, further comprising:
a second interlayer dielectric film on the first hard mask pattern;
third and fourth wires extending longitudinally in one direction within the second interlayer dielectric film and being adjacent to each other;
a second recess within the second interlayer dielectric film between a long side of the third wire and a long side of the fourth wire; and
a second hard mask pattern on the second interlayer dielectric film, the second hard mask pattern including a second opening overlapping with a portion of the third wire and a portion of the fourth wire, wherein a width of the second recess in the one direction is substantially equal to a width of the second opening in the one direction.

8. The semiconductor device as claimed in claim 5, wherein at least an end portion of the second wire being within the recess,
wherein the hard mask pattern covering the end portion of the second wire, and
wherein the air gap between the end portion of the second wire and the first interlayer dielectric film.

9. The semiconductor device as claimed in claim 8, wherein the hard mask pattern includes an opening not overlapping with the end portion of the second wire.

10. The semiconductor device as claimed in claim 8, further comprising an air gap liner along a sidewall of the end portion of the second wire and a profile of the recess.

11. A method for fabricating a semiconductor device, the method comprising:
forming first and second wires extending respectively in a first direction within a first interlayer dielectric film and being adjacent to each other in a second direction different from the first direction;
forming a hard mask pattern with an opening on the first interlayer dielectric film, the opening exposing at least a portion of the interlayer dielectric film between the first wire and the second wire;
performing a plasma treatment process on the interlayer dielectric film exposed by the opening by using the hard mask pattern as a mask;
forming a recess within the interlayer dielectric film by removing the plasma-treated interlayer dielectric film, a width of the recess in the first direction being greater than a width of the opening in the first direction; and
forming an air gap within the recess,
wherein the hard mask pattern overhanging a portion of the air gap, while exposing portions of tops of the first and second wires.

12. The method as claimed in claim 11, wherein forming the recess includes removing the plasma-treated interlayer dielectric film by wet etching.

13. The method as claimed in claim 11, further comprising forming an air gap liner extending along a profile of the recess and extending along an upper surface of the hard mask pattern.

14. The method as claimed in claim 11, wherein forming the air gap includes forming a second interlayer dielectric film on the hard mask pattern.

15. The method as claimed in claim 11, wherein forming the hard mask pattern includes exposing a portion of a sidewall of the first wire and a portion of a sidewall of the second wire.

16. The method as claimed in claim 11, wherein exposing the portions of the sidewalls of the first and second wires includes removing a portion of the interlayer dielectric film by a dry etch process.

* * * * *